(12) United States Patent
Takada et al.

(10) Patent No.: US 11,749,701 B2
(45) Date of Patent: Sep. 5, 2023

(54) REDUCING NOISE IN AN IMAGE CAPTURING DEVICE, IMAGE CAPTURING DEVICE UNIT, AND IMAGE CAPTURING APPARATUS

(71) Applicant: CANON KABUSHIKI KAISHA, Tokyo (JP)

(72) Inventors: Toshiyuki Takada, Tokyo (JP); Naoyuki Nakagawara, Tokyo (JP); Yui Tada, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/143,756

(22) Filed: Jan. 7, 2021

(65) Prior Publication Data

US 2021/0217795 A1 Jul. 15, 2021

(30) Foreign Application Priority Data

Jan. 10, 2020 (JP) .................................. 2020-002888
Jan. 10, 2020 (JP) .................................. 2020-002889
(Continued)

(51) Int. Cl.
*H01L 27/146* (2006.01)
*H04N 25/75* (2023.01)
(Continued)

(52) U.S. Cl.
CPC ....... *H01L 27/14636* (2013.01); *H04N 25/75* (2023.01); *H04N 25/772* (2023.01); *H04N 25/79* (2023.01); *H01L 27/14618* (2013.01)

(58) Field of Classification Search
CPC .. H04N 5/2253; H04N 5/379; H04N 5/37455; H04N 5/378; H04N 5/3577; H01L 27/14636; H01L 27/14618
See application file for complete search history.

(56) References Cited

U.S. PATENT DOCUMENTS

2013/0153751 A1 6/2013 Isogai
2015/0109504 A1* 4/2015 Sakuragi .......... H01L 27/14634
257/459
(Continued)

FOREIGN PATENT DOCUMENTS

JP 2015012211 A 1/2015
JP 2015106787 A 6/2015
(Continued)

OTHER PUBLICATIONS

Extended European Search Report issued in European Appln. No. 21150028.5 dated Oct. 11, 2021.

*Primary Examiner* — Antoinette T Spinks
(74) *Attorney, Agent, or Firm* — ROSSI, KIMMS & McDOWELL LLP

(57) ABSTRACT

An image capturing device unit capable of reducing noise generated in image signals due to power supply. A pixel portion of an image capturing device has pixels arranged in a matrix in first and second directions perpendicular to each other. Output lines are arranged in parallel to the second direction, for reading out pixel signals in the second direction for each of groups of pixels arranged in the first direction. A power supply wiring is arranged on a substrate surface different from a surface on which the image capturing device is mounted and supplies power to the device, and includes a draw-out wiring portion arranged to be routed along the second direction in a pixel portion area which overlaps the pixel portion when the device is projected onto the substrate in a third direction perpendicular to the first and the second directions.

15 Claims, 21 Drawing Sheets

(30) Foreign Application Priority Data

Jan. 10, 2020 (JP) .................................. 2020-002890
Dec. 21, 2020 (JP) .................................. 2020-211538

(51) Int. Cl.
*H04N 25/79* (2023.01)
*H04N 25/772* (2023.01)

(56) References Cited

U.S. PATENT DOCUMENTS

| | | |
|---|---|---|
| 2019/0174087 A1 | 6/2019 | Kim |
| 2021/0233948 A1* | 7/2021 | Joei .................... H01L 27/1464 |
| 2023/0103993 A1* | 4/2023 | Sano ................... H04N 25/709 |
| | | 348/294 |

FOREIGN PATENT DOCUMENTS

| | | | |
|---|---|---|---|
| JP | 2017076872 A | 4/2017 |
| JP | 2017103517 A | 6/2017 |

* cited by examiner

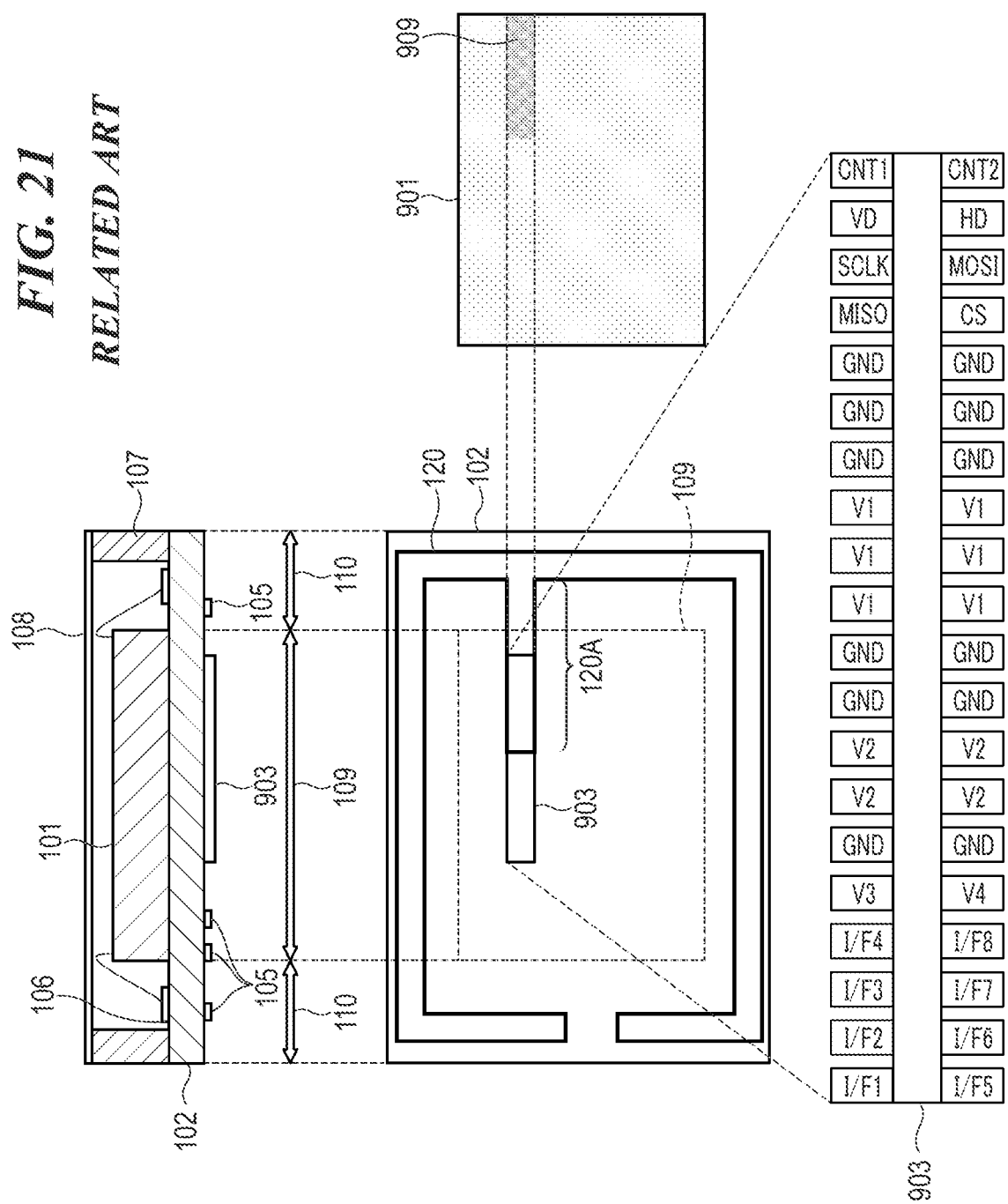

REDUCING NOISE IN AN IMAGE CAPTURING DEVICE, IMAGE CAPTURING DEVICE UNIT, AND IMAGE CAPTURING APPARATUS

BACKGROUND OF THE INVENTION

Field of the Invention

The present invention relates to an image capturing device, an image capturing device unit and an image capturing apparatus, and more particularly to a technique for reducing noise generated in image signals due to a magnetic field generated by electric current flowing through a power supply wiring arranged in the vicinity of the image capturing device.

Description of the Related Art

An electronic apparatus equipped with an image capturing device unit is demanded to be reduced in weight and size, and the image capturing device unit is also demanded to be reduced in size accordingly. In general, a conventional image capturing device unit has a structure that a package formed of ceramics or plastics and having a U-shaped structure has an image capturing device mounted therein and sealed with cover glass, and the package is mounted on a printed circuit board on which peripheral circuit components are mounted. As one of methods of reducing the size of the image capturing device unit, Japanese Laid-Open Patent Publication (Kokai) No. 2015-12211 has proposed a structure that an image capturing device is directly mounted on a printed circuit board. Also, Japanese Laid-Open Patent Publication (Kokai) No. 2015-106787 has proposed an image capturing device unit that is reduced in thickness by directly mounting an image capturing device on a printed circuit board. Further, Japanese Laid-Open Patent Publication (Kokai) No. 2017-76872 has proposed an image capturing device that is reduced in size by laminating pixel portions and signal processing sections of the image capturing device.

The image capturing device units described in Japanese Laid-Open Patent Publication (Kokai) No. 2015-12211 and Japanese Laid-Open Patent Publication (Kokai) No. 2015-106787 can be reduced in thickness, compared with the conventional image capturing device unit. However, there is a problem that the image capturing device is physically close to the power supply wiring on the printed circuit board, and hence the image capturing device is susceptible to a magnetic field generated by electric current flowing through the power supply wiring so that noise is liable to be generated in image signals which are output from the image capturing device.

Further, the image capturing device described in Japanese Laid-Open Patent Publication (Kokai) No. 2017-76872 can be reduced in area, compared with the conventional image capturing device. However, there is a problem that since the signal processing sections exist in the vicinity of the pixel portions, noise is liable to be generated in a captured image due to the influence of a magnetic field generated from a power supply wiring of the signal processing sections.

Further, it is generally known that the influence of a magnetic field generated by electric current flowing through the power supply wiring on its surrounding depends on the current variation per unit time. Therefore, to attain size reduction of the image capturing device unit and noise reduction of the image signals, it is necessary to consider the current variation in the power supply wiring which is a factor responsible for generation of noise.

Further, there is a problem that the current variation per period of a horizontal synchronization signal for the image capturing device has become larger than before, due to increase in the number of pixels and increase in the speed of readout of the image capturing device in recent years, and an S/N ratio of the image signal output from the image capturing device is reduced by a magnetic field due to the current variation. In general, noise components are eliminated by CDS (correlated double sampling). However, two-dimensional noise is generated in the image signals because the magnitude of a magnetic field generated in the readout period of the signal components is different from that of a magnetic field generated in the readout period of the noise components.

SUMMARY OF THE INVENTION

The present invention provides an image capturing device unit that is capable of reducing noise generated in image signals due to a magnetic field generated by electric current flowing through a power supply wiring.

Further, the present invention provides an image capturing device unit, compact in size, which is capable of reducing the current variation in the power supply wiring.

In a first aspect of the present invention, there is provided an image capturing device unit including a substrate, and an image capturing device mounted on the substrate, the image capturing device comprising a pixel portion that has a plurality of pixels arranged in a matrix in a first direction and a second direction perpendicular to each other, and output lines that are arranged in parallel to the second direction and reads out pixel signals in the second direction from each of groups of pixels arranged in the first direction, the substrate comprising a power supply wiring that is arranged on a different surface from a surface on which the image capturing device is mounted and supplies power to the image capturing device, wherein the power supply wiring includes a first power supply wiring portion arranged so as not to be routed along the second direction in a pixel portion area which overlaps the pixel portion when the image capturing device is projected onto the substrate in a third direction perpendicular to the first direction and the second direction.

In a second aspect of the present invention, there is provided an image capturing device unit including a substrate, and an image capturing device mounted on the substrate, the image capturing device comprising a pixel portion that has a plurality of pixels arranged in a matrix in a first direction and a second direction perpendicular to each other, output lines that are arranged in parallel to the second direction and read out pixel signals in the second direction from each of groups of pixels arranged in the first direction, a signal processing section that is arranged in parallel to the second direction and performs analog-to-digital convention on pixel signals of each of the groups of pixels arranged in the first direction, and reference signal lines that are arranged in parallel to the first direction and supply reference signals to the signal processing section when the signal processing section performs analog-to-digital convention, the substrate comprising a power supply wiring that is arranged on a different surface from a surface on which the image capturing device is mounted to supply power to the image capturing device, wherein the power supply wiring includes a third power supply wiring portion arranged so as not to overlap the reference signal lines when the image capturing device is projected onto the substrate in a third direction perpendicular to the first direction and the second direction.

In a third aspect of the present invention, there is provided an image capturing device including a light receiving layer and a signal processing layer, the signal processing layer comprising a plurality of signal processing circuits, a connector to which power is supplied from an outside, and a plurality of power supply wirings which are drawn out from a power supply connection portion serving as a contact point brought into contact with the connector, toward an end of the signal processing layer in different directions and are connected to at least one of the plurality of signal processing circuits.

According to the present invention, it is possible to reduce noise generated in image signals due to a magnetic field generated by electric current flowing through the power supply wiring to thereby reduce deterioration of the image signals.

Further, according to the present invention, it is possible to reduce current variation in the power supply wiring of the image capturing device unit even when the image capturing device unit is configured to be compact in size.

Further features of the present invention will become apparent from the following description of exemplary embodiments (with reference to the attached drawings).

BRIEF DESCRIPTION OF THE DRAWINGS

FIG. 21 is a view useful in explaining an example of the configuration of a conventional image capturing device unit.

DESCRIPTION OF THE EMBODIMENTS

The present invention will now be described in detail below with reference to the accompanying drawings showing embodiments thereof.

Figure 1:
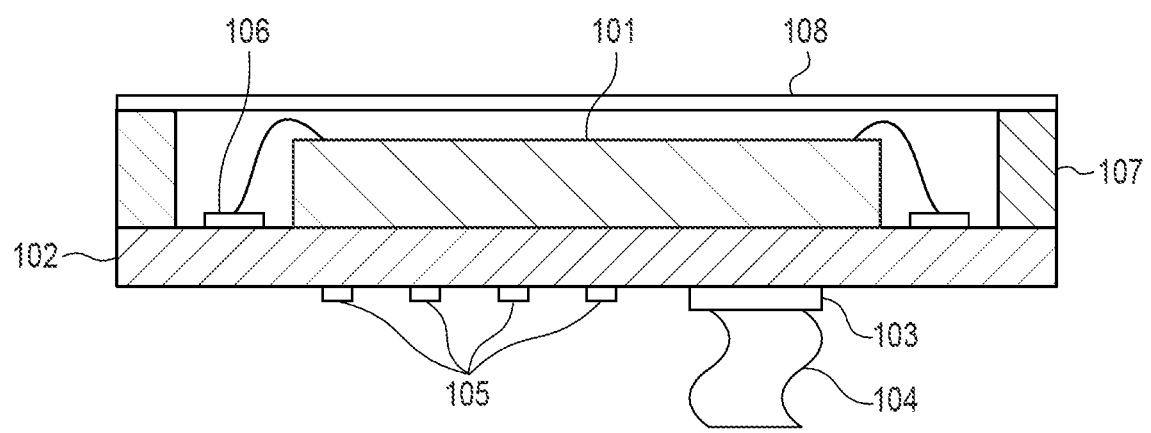
FIG. 1 is a cross-sectional view showing a schematic configuration of an image capturing device unit according to a first embodiment.

FIG. 1 is a cross-sectional view showing a schematic configuration of an image capturing device unit according to a first embodiment. The image capturing device unit includes an image capturing device 101, an imaging substrate 102, a connector 103, a flexible wiring board 104, electronic components 105, wire bonding pads 106, a frame portion 107, and a cover glass 108.

FIG. 1 shows a cross-section perpendicular to an imaging surface of the image capturing device 101 on which an optical image is formed. The image capturing device 101 is e.g. a CMOS image sensor that outputs image signals according to incident light. The image capturing device 101 is, more specifically, a CMOS image sensor using an X-Y address method, and performs an image capturing operation according to a control signal delivered from a control circuit, not shown, to output image signals, as described hereinafter with reference to FIGS. 2 and 3. Note that a signal (pixel signal) output from each of a plurality of pixels 260 (see FIG. 2) forming the image capturing device 101 is a signal for forming an image, and hence the signals output from the pixels 260 are referred to as the "image signals" in the description.

The imaging substrate 102 is a printed circuit board on which the image capturing device 101 and the like are mounted and which includes a power supply wiring formed of a metal, such as copper. A rigid substrate is preferably used for the imaging substrate 102 so as to mount the image capturing device 101, and for example, the imaging substrate 102 is formed of glass epoxy or the like. However, this is not limitative, but the imaging substrate 102 may be a flexible substrate using a plastic material, or a LTCC (Low-Temperature Co-Fire Ceramics) substrate using ceramics and copper wiring. That is, the imaging substrate 102 is only required to be a substrate which is made by forming a metallic wiring pattern of copper or the like on a specific material and on which components can be mounted.

The connector 103 is a connection terminal, such as a flexible connector or a board-to-board connector, which has a plurality of contacts, and is mounted on the imaging substrate 102. The flexible wiring board 104 has one end connected to the connector 103 and the other end partially connected to a power source, not shown. Therefore, power is supplied from the outside to the connector 103 via the flexible wiring board 104. Note that the flexible wiring board 104 may include wiring other than the wiring for supplying power, such as wiring for transmitting control signals or image signals output from the image capturing device 101. Further, a thin-wire coaxial cable or the like may be used in place of the flexible wiring board 104.

The electronic components 105 are active components including a regulator that supplies power to the image capturing device 101 and an oscillator that supplies a main clock to the image capturing device 101, and passive components including a bypass capacitor that filters noise components of the power supply so as to cause the image capturing device 101 to stably operate.

Wire bonding pads 106 are electrodes formed, specifically by performing treatment, such as gold-plating, on a surface layer of the imaging substrate 102, so to connect between the image capturing device 101 and the imaging substrate 102 by wire bonding and the like. The wire bonding pads 106 are arranged on the same surface of the imaging substrate 102 on which the image capturing device 101 is mounted.

The frame portion 107 is formed on an outer periphery of the imaging substrate 102 such that it is adhered to the imaging substrate 102 and holds the cover glass 108. The cover glass 108 is a member for sealing the image capturing device 101 and is adhesively fixed to the frame portion 107. Note that the cover glass 108 has an antireflection film or the like formed thereon.

Figure 2:
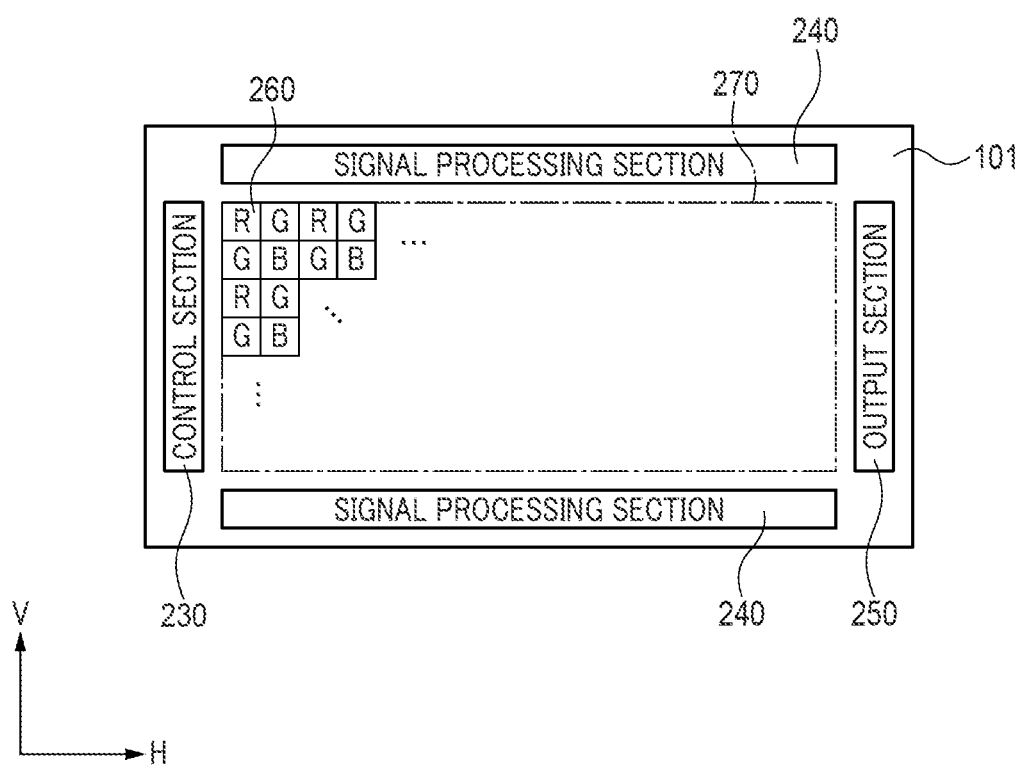
FIG. 2 is a plan view showing a schematic configuration of an image capturing device included in the image capturing device unit.

FIG. 2 is a plan view showing a schematic configuration of the image capturing device 101. The image capturing device 101 is a CMOS sensor including a pixel portion 270 formed by the pixels 260, a control section 230, signal processing sections 240, and an output section 250. The pixel portion 270 is formed by the pixels 260 arranged in a matrix in a horizontal direction (H direction (first direction)) and a vertical direction (V direction (second direction)), perpendicular to each other. Further, on the pixel portion 270, there are arranged color filters in 2×2 arrays formed by repeating a red (R) filter and a green (G) filter in odd-numbered rows and repeating the green (G) filter and a blue (B) filter in even-numbered rows, such that they correspond to the pixels 260, respectively.

The control section 230 is a circuit that selects pixels from the pixel arrays of the pixel portion 270 on a row-by-row basis and performs driving control of reset operation and readout operation with respect to the selected pixel row. The signal processing sections 240 each are a circuit that performs signal processing, including analog-to-digital conversion, on image signals received via vertical output lines 310 row by row (see FIG. 3). The output section 250 is a circuit that outputs the digital image signals converted row by row to the outside of the image capturing device 101.

Figure 3:
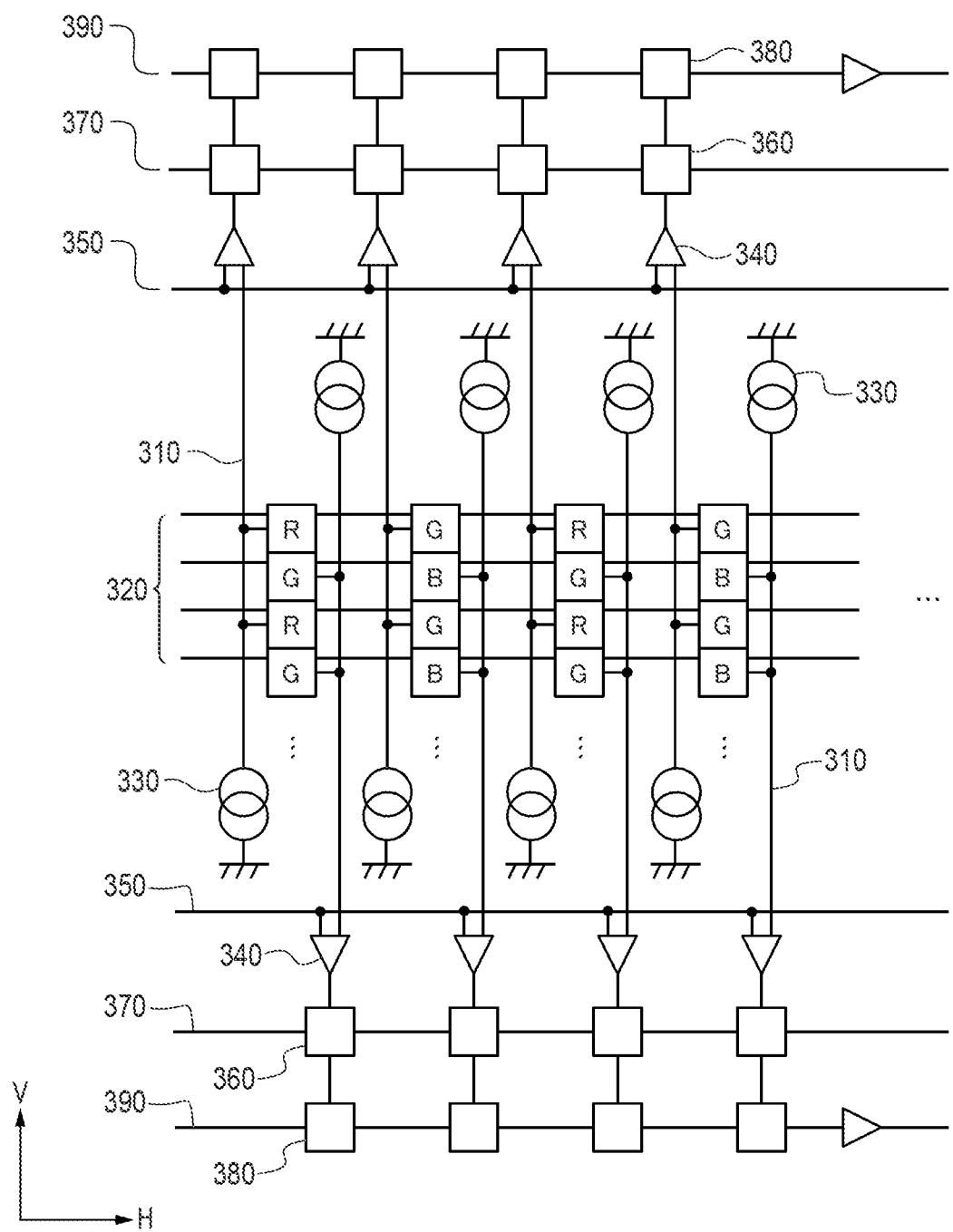
FIG. 3 is a diagram useful in explaining signal processing performed by the image capturing device.

FIG. 3 is a diagram useful in explaining signal processing performed in the image capturing device 101. Each vertical output line 310 is commonly connected to pixels of each associated column. Image signals of a row selected by one of pixel control lines 320 are read out by the associated vertical output lines 310, respectively. Further, each pixel control line 320 simultaneously controls one horizontal line of pixels 260 and enables reset and readout of signals. Load current sources 330 drive a selected row of pixels 260 via the associated vertical output lines 310.

To one of input terminals of each comparator 340, an analog signal output from each pixel 260 is input. To the other input terminal of each comparator 340, a reference signal line 350 is connected, and a reference signal output from a reference signal generator, not shown, is input via the reference signal line 350. Further, an output terminal of each comparator 340 is connected to an associated one of latch circuits 360. Each latch circuit 360 holds a count value of a counter, not shown, input from a signal line 370 at a timing when the output of an associated one of the comparators 340 has changed. The held count value is stored in an associated one of memories 380 and held as a digital value. Various processing operations, such as an offset processing operation and a gain processing operation for the digital signals stored in the memories, are performed at downstream stages of the signal processing sections 240 to which the digital signals are transferred via horizontal transfer lines 390. The digital signals transferred via the signal processing sections 240 are output from the output section 250 to the outside via an I/F (interface). This interface is e.g. a Sub-LVDS interface, a SLVS interface, or a SLVS-EC interface.

Figure 4:
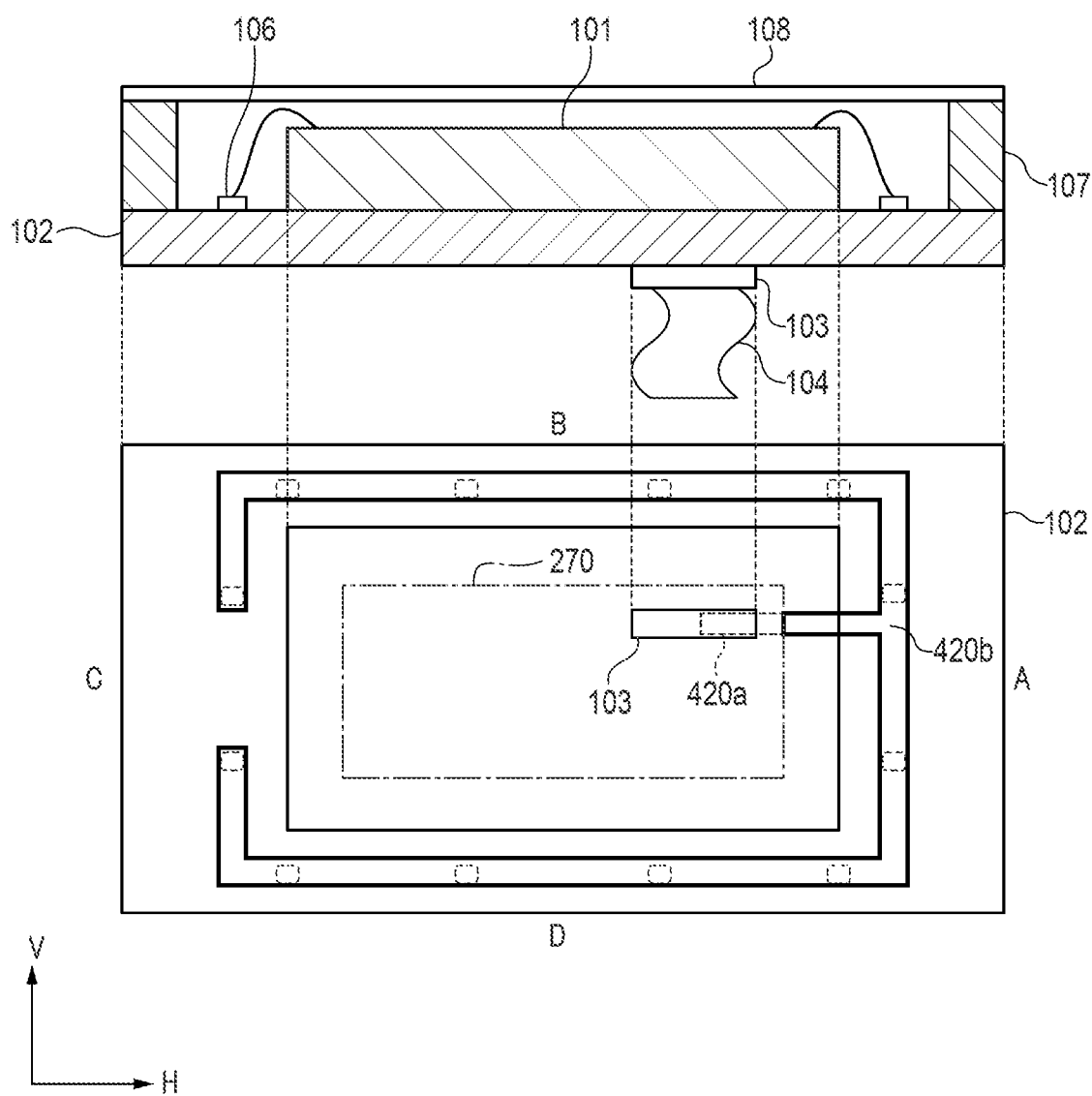
FIG. 4 is a view showing a power supply wiring pattern according to the first embodiment, which is arranged on an imaging substrate.

FIG. 4 is a view showing a power supply wiring pattern according to the first embodiment, which is arranged on the imaging substrate 102, illustrating the surface on which the connector 103 is mounted. The image capturing device 101 and the wire bonding pads 106 are mounted on the surface opposite to the surface on which the connector 103 is mounted.

The image capturing device 101 has a plurality of input terminals for inputting power supply, and therefore, the wire bonding pads 106 for inputting power supply are also provided in plurality.

In the following description, a right end face, an upper end face, a left end face, and a lower end face of the imaging substrate 102, as viewed in FIG. 4, are defined as the end face A, the end face B, the end face C, and the end face D, respectively, for convenience of explanation. Further, an area on the imaging substrate 102, where the pixel portion 270 overlaps when the image capturing device 101 is projected onto the imaging substrate 102 in a direction perpendicular to the imaging surface of the image capturing device 101, is referred to as the "pixel portion area", and an area on the imaging substrate 102 outside the pixel portion area is referred to as the "pixel portion outside area".

A draw-out wiring portion 420a (first power supply wiring portion) is provided such that it is drawn out from the connector 103 (electrical connection portion connected to a power supply terminal of the connector 103) toward the end face A. The draw-out wiring portion 420a is drawn out toward the end face A for the purpose of suppressing lowering of quality of the image signals of the image capturing device 101, which is caused by variation in electric current flowing through the draw-out wiring portion 420a.

More specifically, the image signals of the image capturing device 101 are read out through the vertical output lines 310, and hence the image signals are significantly affected by a magnetic field in the vertical direction (V direction) along the vertical output lines 310. To prevent this, as the direction of drawing out the draw-out wiring portion 420a, not a vertical direction toward the end face B or the end face D, but a direction toward the end face A, which is substantially parallel to the H direction, is selected. Note that if the draw-out wiring portion 420a is drawn out toward the end face C, the wiring length in the H direction becomes longer than in the case where the draw-out wiring portion 420a is drawn out toward the end face A. For this reason, the draw-out wiring portion 420a is drawn out from the electrical connection portion connected to the power supply terminal of the connector 103 toward the end face A such that the wiring length in the pixel portion area becomes as short as possible.

Note that in the first embodiment, the draw-out wiring portion 420a is arranged on a surface layer of the imaging substrate 102 on which the connector 103 is mounted. However, this is not limitative, but for example, in a case where the imaging substrate 102 is a multi-layer substrate, the draw-out wiring portion 420a may be arranged in an inner layer of the substrate. The draw-out wiring portion 420a in this case is routed from the electrical connection portion connected to the connector 103 provided on the surface of the substrate to the inner layer of the substrate, then toward the end face A in the inner layer, and then taken out from the inner layer to the surface layer of the multi-layer substrate at the outer periphery of the pixel portion area or the pixel portion outside area.

The draw-out wiring portion 420a drawn out toward the end face A of the imaging substrate 102 is connected to a wiring portion 420b (second power supply wiring portion) arranged along the outer periphery of the imaging substrate 102 in the pixel portion outside area. The wiring portion 420b is connected to the wire bonding pads 106 at portions indicated by broken lines depicted in a state superimposed on the wiring portion 420b. Here, to reduce the influence of a magnetic field generated by electric current flowing through the wiring portion 420b on the pixel portion 270, it is desirable that the wiring portion 420b is arranged such that the wiring portion 420b with a predetermined distance (for example, approximately several millimeters) from the outer periphery of the pixel portion area.

As described above, in the first embodiment, the draw-out wiring portion 420a is arranged so as not to extend parallel to the wiring direction of the vertical output lines 310 in the pixel portion area of the image capturing device 101. This makes it possible to reduce noise generated in image signals by a magnetic field generated in accordance with variation in electric current flowing through the draw-out wiring portion 420a during driving of the image capturing device 101. Further, in a case where CDS is performed when reading out image signals from the image capturing device 101, it is also possible to reduce noise generated in the image signals by a magnetic field at each sampling timing. This makes it possible to obtain high image quality based on the image signals reduced in noise (image signals with a high S/N ratio).

Figure 5:
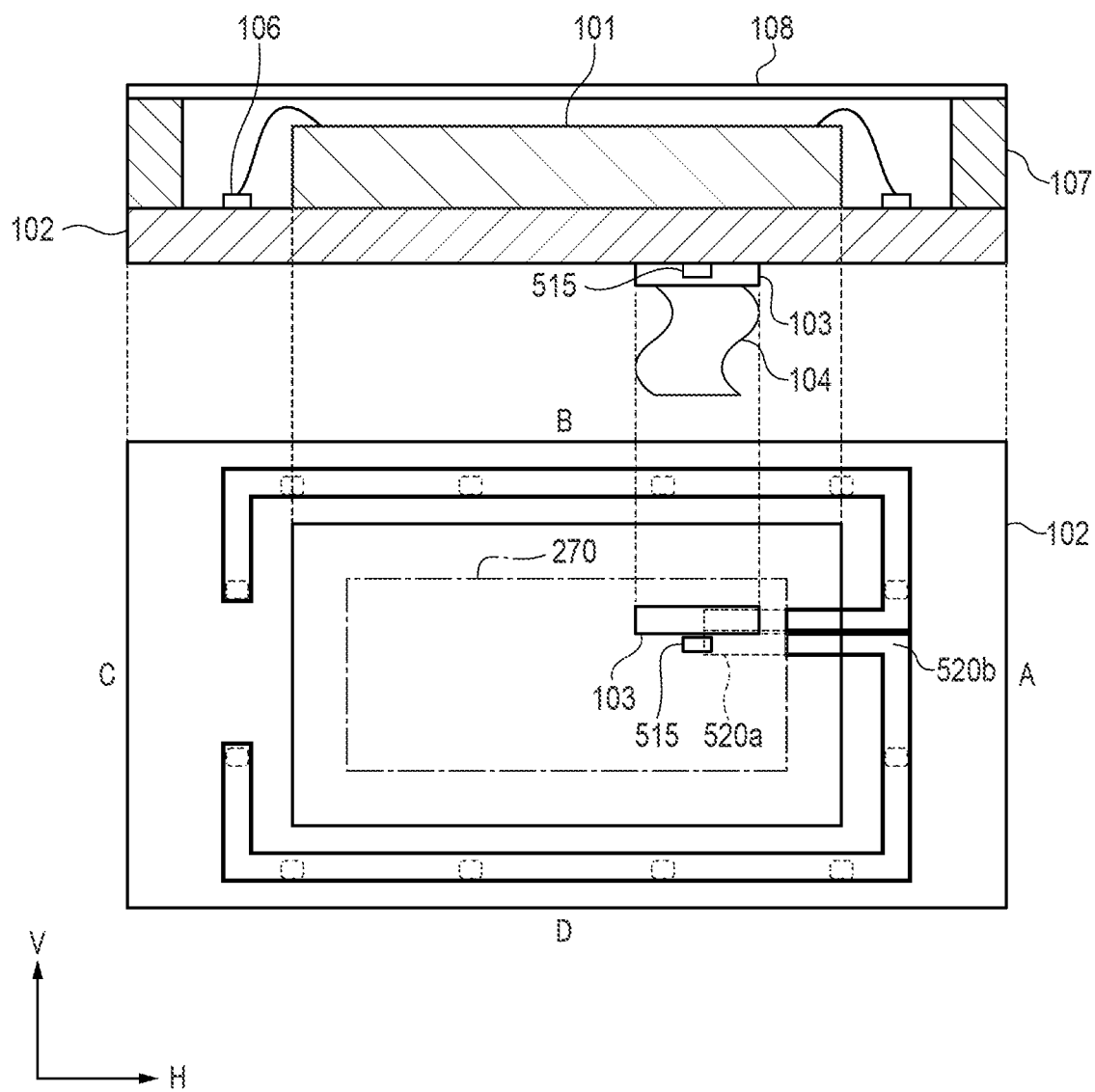
FIG. 5 is a view showing a power supply wiring pattern according to a second embodiment, which is arranged on an imaging substrate.

In a second embodiment, another example of the power supply wiring pattern arranged on the imaging substrate 102 will be described. FIG. 5 is a view showing a power supply wiring pattern according to the second embodiment, which is arranged on the imaging substrate 102, illustrating, similar to FIG. 4, the surface on which the connector 103 is mounted.

The configuration shown in FIG. 5 differs from the configuration shown in FIG. 4 in that a capacitor 515 is mounted in the vicinity of the connector 103. For example, in a case where the flexible wiring board 104 is long because the power supply section is distant from the imaging substrate 102, it is desirable to dispose the capacitor 515 in the vicinity of the connector 103 so as to avoid variation in power supply, which is caused by the long wiring length of the power supply.

In a case where the capacitor 515 is arranged in the vicinity of the connector 103, it is required to form a power supply wiring in an optimum pattern. More specifically, similar to the first embodiment, it is desirable to draw out the power supply wiring from the electrical connection portion connected to the power supply terminal of the connector 103 in the H direction.

In addition, it is ideal to dispose the capacitor 515 such that electrodes of the capacitor 515 extend in the H direction (such that the long sides of the capacitor 515 are substantially parallel to the H direction). That is, the capacitor 515 is disposed so as to prevent the orientation of the capacitor 515 from becoming parallel to the wiring direction of the vertical output lines 310 in the pixel portion area of the image capturing device 101. This makes it possible to reduce noise generated in the image signals by a magnetic field generated when electric current is supplied from the capacitor 515.

To this end, in the second embodiment, as shown in FIG. 5, a draw-out wiring portion 520a is arranged to be drawn out from the electrical connection portion connected to the power supply terminal of the connector 103 and the electrodes of the capacitor 515, toward the end face A. With this, it is possible to reduce noise generated in the image signals by a magnetic field generated in accordance with variation in electric current flowing through the draw-out wiring portion 520a during driving of the image capturing device 101. Note that similar to the first embodiment (see FIG. 4), the draw-out wiring portion 520a is connected to a wiring portion 520b arranged along the outer periphery of the imaging substrate 102 in the pixel portion outside area.

As described above, in the second embodiment, similar to the first embodiment, the draw-out wiring portion 520a is arranged so as not to extend parallel to the wiring direction of the vertical output lines in the pixel portion area, and the wiring portion 520b is arranged along the outer periphery of the imaging substrate 102 in the pixel portion outside area. With this, it is possible to reduce noise generated in the image signals by a magnetic field generated in accordance with variation in electric current flowing through the draw-out wiring portion 520a and the wiring portion 520b during driving of the image capturing device 101, and thereby obtain high image quality. Further, in the second embodiment, the capacitor 515 for supplying power is arranged in the vicinity of the connector 103. This makes it possible to suppress variation in power supply.

Figure 6:
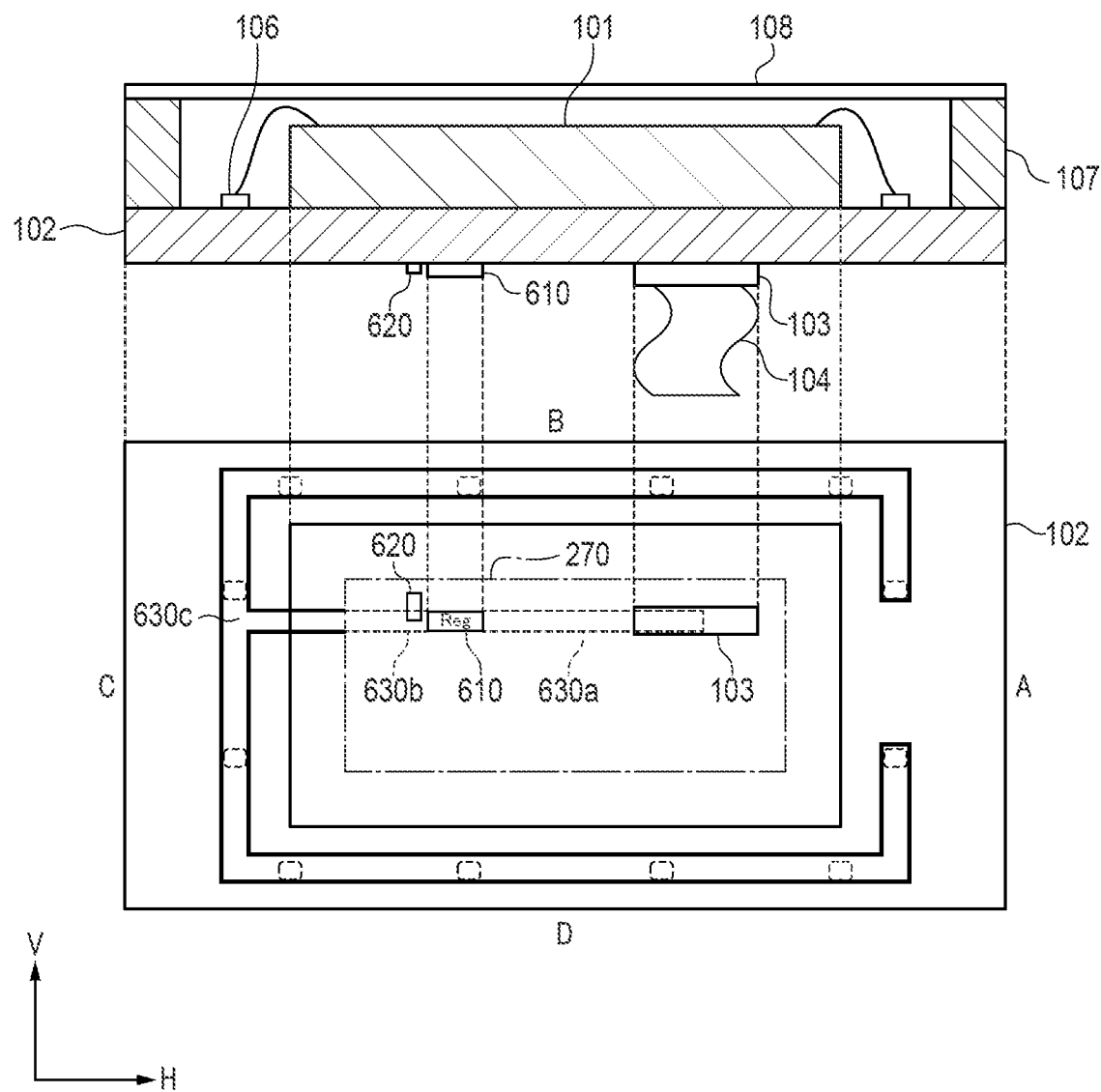
FIG. 6 is a view showing a power supply wiring pattern according to a third embodiment, which is arranged on an imaging substrate.

In a third embodiment, still another example of the power supply wiring pattern arranged on the imaging substrate 102 will be described. FIG. 6 is a view showing the power supply wiring pattern according to the third embodiment, which is arranged on the imaging substrate 102, illustrating, similar to FIG. 4, the surface on which the connector 103 is mounted.

Here, a case is assumed where the voltage level of power supplied from the power supply section, not shown, via the connector 103 is converted in the imaging substrate 102 so as to use the power. Therefore, the configuration shown in FIG. 6 differs from the configurations shown in FIGS. 4 and 5 in that a draw-out wiring portion 630a drawn out from the connector 103 is connected to a regulator 610.

The draw-out wiring portion 630a and a draw-out wiring portion 630b are arranged within the pixel portion area. The draw-out wiring portion 630a is arranged to be drawn out from the electrical connection portion connected to the power supply terminal of the connector 103, toward the end face C, substantially in parallel to the H direction, and is connected to an input terminal of the regulator 610. The draw-out wiring portion 630b is arranged to be drawn out from an electrical connection portion connected to an output terminal of the regulator 610, further toward the end face C, substantially in parallel to the H direction up to the outer periphery of the pixel portion area. The draw-out wiring portion 630b is connected to a wiring portion 630c arranged in the pixel portion outside area. Similar to the wiring portion 420b appearing in FIG. 4, the wiring portion 630c is arranged along the outer periphery of the imaging substrate 102 in the pixel portion outside area and is connected to the wire bonding pads 106 at predetermined locations.

As described above, also in the case where the power is supplied to the image capturing device 101 by arranging the regulator 610 in the imaging substrate 102, the draw-out wiring portions are arranged in the pixel portion area along the H direction of the image capturing device 101. Further, the portion of the power supply wiring in the pixel portion outside area is arranged along the outer periphery of the imaging substrate 102. With this, it is possible to obtain the same advantageous effects as provided by the first embodiment. Further, as shown in FIG. 6, a capacitor 620 is mounted in the vicinity of the output side (side toward the draw-out wiring portion 630b) of the regulator 610. This makes it possible to suppress current variation during driving of the image capturing device 101 and thereby stably supply power.

As described above, also in the third embodiment, similar to the first embodiment, the draw-out wiring portions 630a and 630b are arranged such that they do not extend parallel to the wiring direction of the vertical output lines 310 in the pixel portion area, and the wiring portion 630c is arranged along the outer periphery of the imaging substrate 102 in the pixel portion outside area. With this, in the case where the power supply wiring is arranged with the regulator 610 interposed therein, it is also possible to reduce noise generated in the image signals by a magnetic field generated in accordance with variation in electric current flowing through the draw-out wiring portions 630a and 630a and the wiring portion 630c during driving of the image capturing device 101, and thereby obtain high image quality. Further, by mounting the capacitor 620 in the vicinity of the output side of the regulator 610, it is possible to stably supply power to the image capturing device 101.

Figure 7:
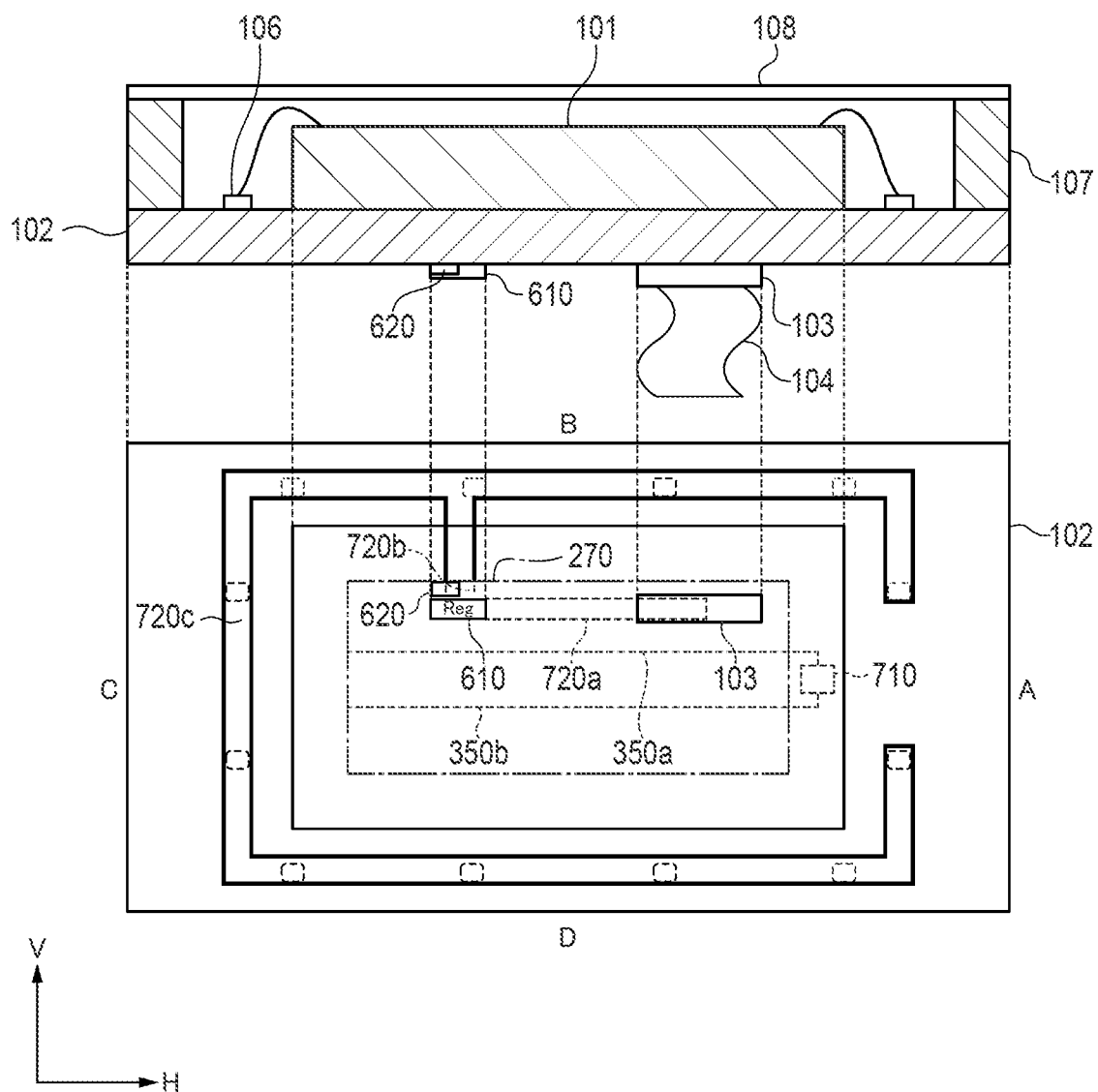
FIG. 7 is a view showing a power supply wiring pattern according to a fourth embodiment, which is arranged on an imaging substrate.

In a fourth embodiment, an example in which a power supply wiring is arranged such that the power supply wiring does not extend parallel to internal signal lines horizontally routed within the image capturing device 101. FIG. 7 is a view showing a power supply wiring pattern according to a fourth embodiment, which is arranged on an imaging substrate, illustrating, similar to FIG. 4, the surface on which the connector 103 is mounted. Common components and elements are denoted by the same reference numerals, and detailed description thereof is omitted.

Here, a case is assumed where the voltage level of power supplied from the power supply section, not shown, via the connector 103 is converted in the imaging substrate 102 so as to use the power. Therefore, similar to FIG. 6, FIG. 7 shows a configuration in which a draw-out wiring portion 720a drawn out from the connector 103 is connected to the regulator 610.

In a case where the image capturing device 101 is projected onto the imaging substrate 102 in a direction perpendicular to the imaging surface of the image capturing device 101, the reference signal lines 350 in FIG. 3 are expressed in FIG. 7 as reference signal lines 350a and 350b. The reference signal lines 350a and 350b are connected to a reference signal generator 710.

When the image capturing device 101 reads out image signals, the reference signal generator 710 outputs reference signals of which the voltage is changed by a predetermined change amount. Although the reference signal generator 710 is singly provided in FIG. 7, the configuration may be such that a plurality of different reference signal generators are provided for respective sets of even-numbered lines and odd-numbered lines of pixels in the pixel portion 270.

The reference signal line 350a is for inputting a reference signal to each comparator 340 provided at a location toward the end face B and connected to an associated one of the vertical output lines 310. The reference signal line 350b is for inputting a reference signal to each comparator 340 provided at a location toward the end face D and connected to an associated one of the vertical output lines 310. In other words, the reference signal lines 350a and 350b are arranged to extend in the horizontal direction (H direction) of the image capturing device 101, and hence are susceptible to magnetic noise from the read-out wiring portion 720a and a read-out wiring portion 720b. Further, since the reference signals are used for analog-to-digital conversion of image signals of the image capturing device 101, and hence it is presumed that noise superimposed on the reference signals generates shading in a horizontal direction in an image.

Therefore, to reduce the influence of a magnetic field generated by electric current flowing through the read-out wiring portions 720a and 720b on the reference signal lines 350a and 350b, it is preferable that the read-out wiring portions 720a and 720b are arranged with a predetermined distance from the reference signal lines 350a and 350b. Further, since the connector 103 connects between the power supply section and the power supply wiring, it is preferable that the connector 103 is arranged with a predetermined distance from the reference signal lines 350a and 350b.

Note that the read-out wiring portion 720b drawn out toward the end face B of the imaging substrate 102 is connected to a wiring portion 720c arranged along the outer periphery of the imaging substrate 102 in the pixel portion outside area. The wiring portion 720c is connected to the wire bonding pads 106 at portions indicated by broken lines depicted in a state superimposed on the wiring portion 720c. In a case where the image substrate 102 is a multi-layer substrate, the draw-out wiring portion 720a and 720b may be arranged in an inner layer of the substrate.

As described above, in the fourth embodiment, the draw-out wiring portions 720a and 720b are arranged with a predetermined distance from the reference signal lines 350a and 350b in the pixel portion area, and the wiring portion 720c is arranged along the outer periphery of the imaging substrate 102 in the pixel portion outside area. With this, in the case where the reference signal lines 350a and 350b are arranged to extend in the horizontal direction, it is possible to reduce noise generated in the image signals by a magnetic field generated in accordance with variation in electric current flowing through the power supply wiring (the draw-out wiring portions 720a and 720b) during driving of the image capturing device 101, and thereby obtain high image quality. Although this embodiment has been described by taking the reference signal lines as an example, this is not limitative, but the head present invention can be applied to any signal lines insofar as they can be signal lines for reference signals, which extend in a horizontal direction.

Figure 8:
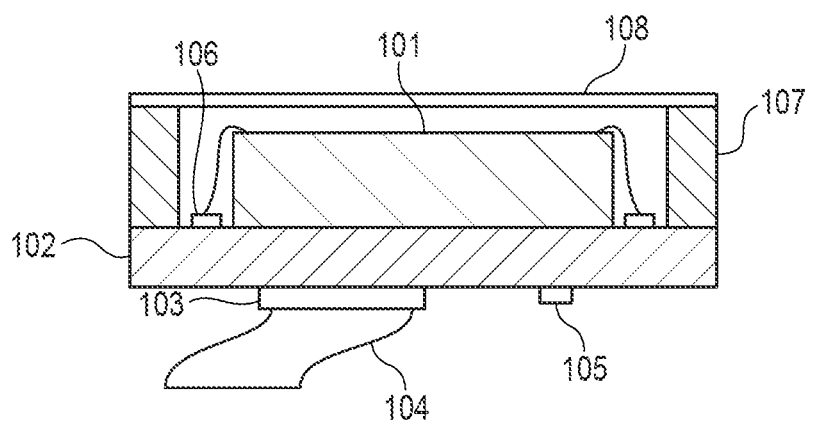
FIG. 8 is a cross-sectional view showing a schematic configuration of an image capturing device unit according to a fifth embodiment.

FIG. 8 is a cross-sectional view showing a schematic configuration of an image capturing device unit according to a fifth embodiment. The image capturing device unit includes the image capturing device 101, the imaging substrate 102, the connector 103, the flexible wiring board 104, the electronic component 105, the wire bonding pads 106, the frame portion 107, and the cover glass 108.

The image capturing device 101 is e.g. a CMOS image sensor that outputs image signals according to incident light. Note that FIG. 8 shows a cross-section perpendicular to the imaging surface of the image capturing device 101 on which an optical image is formed. The imaging substrate 102 is a printed circuit board on which the image capturing device 101 and the like are mounted and which includes a power supply wiring formed of a metal, such as copper. A rigid substrate is preferably used for the imaging substrate 102 so as to mount the image capturing device 101, and for example, the imaging substrate 102 is formed of e.g. glass epoxy. However, this is not limitative, but the imaging substrate 102 may be a flexible substrate using a plastic material, or a LTCC (Low-Temperature Co-Fire Ceramics) substrate using ceramics and copper wiring. That is, the imaging substrate 102 is only required to be a substrate which is made by forming a metallic wiring pattern of copper or the like on a specific material and on which components can be mounted.

The connector 103 is a connection terminal having a plurality of contacts and is mounted on the imaging substrate 102. The flexible wiring board 104 has one end connected to the connector 103 and the other end partially connected to a power source, not shown. Therefore, power is supplied from the outside to the connector 103 via the flexible wiring board 104. Note that the flexible wiring board 104 may include wiring other than the wiring for supplying power, such as wiring for transmitting control signals and image signals output from the image capturing device 101. Further, a thin-wire coaxial cable or the like may be used in place of the flexible wiring board 104.

The electronic component 105 is a regulator, a capacitor, or the like, necessary for operating the image capturing device 101, and supplies a desired voltage to the image capturing device 101, using power supplied via the connector 103 from the flexible wiring board 104, as input. The electronic component 105 is arranged in the vicinity of the connector 103, and therefore, it is considered that the influence of electric current flowing through the power supply wiring between the electronic component 105 and the connector 103 on the image capturing device 101 is small.

Wire bonding pads 106 are electrodes formed, specifically by performing treatment, such as gold-plating, on a surface layer of the imaging substrate 102, so as to connect between the image capturing device 101 and the imaging substrate 102 e.g. by wire bonding. The wire bonding pads 106 are arranged on the same surface of the imaging substrate 102 on which the image capturing device 101 is mounted.

The frame portion 107 is formed on an outer periphery of the imaging substrate 102 such that it is adhered to the imaging substrate 102 and holds the cover glass 108. The cover glass 108 is a member for sealing the image capturing device 101 and is adhesively fixed to the frame portion 107. Note that the cover glass 108 has an antireflection film or the like formed thereon.

Figure 13:
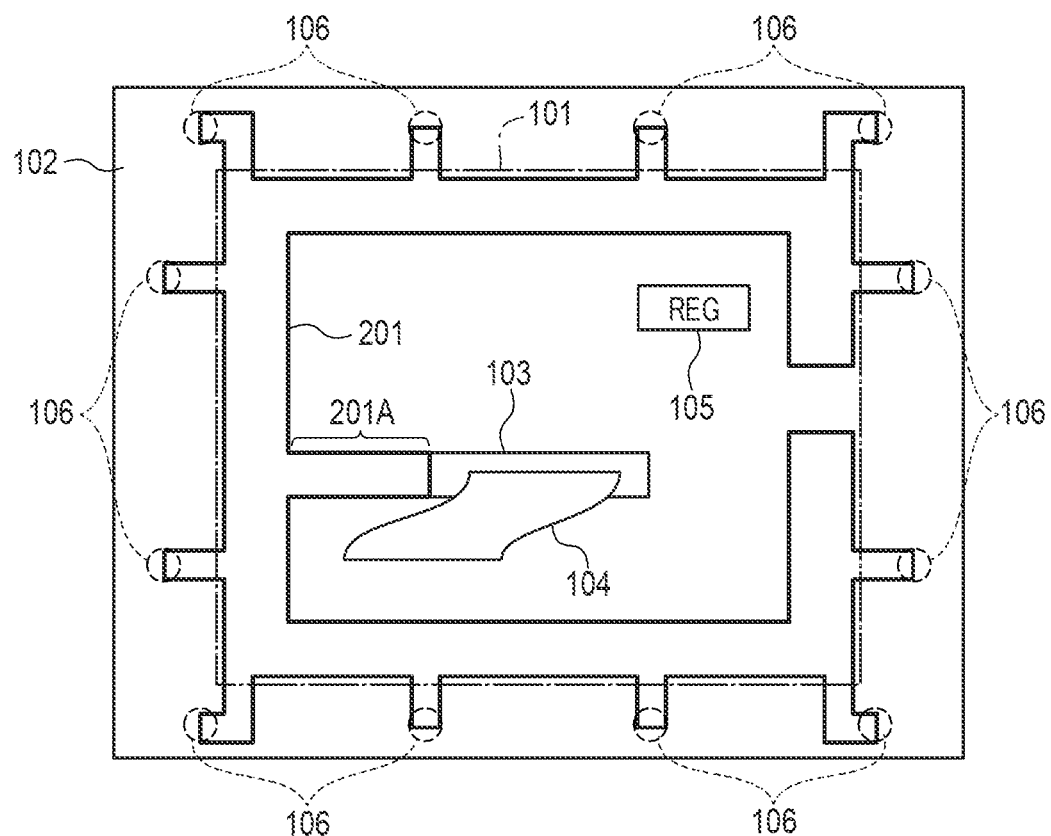
FIG. 13 is a view showing an example of a power supply wiring pattern on a conventional imaging substrate.

Here, an example of a power supply wiring pattern on an imaging substrate of a conventional image capturing device unit will be described. FIG. 13 is a view showing the example of the power supply wiring pattern arranged on the imaging substrate of the conventional image capturing device unit. The conventional image capturing device unit, shown in FIG. 13, differs from the image capturing device unit according to the present embodiment, shown in FIG. 8, only in the power supply wiring pattern arranged on the imaging substrate. Therefore, out of the component elements of the conventional image capturing device unit, shown in FIG. 13, as for the same components as those of the image capturing device unit according to the present embodiment, shown in FIG. 8, description will be given using the same names and reference numerals as those of the image capturing device unit according to the present embodiment, shown in FIG. 8.

FIG. 13 shows the surface of the imaging substrate 102 on which the connector 103 is mounted. The image capturing device 101 and the wire bonding pads 106 are mounted on a surface different from the surface on which the connector 103 is mounted. Further, in FIG. 13, out of the plurality of wire bonding pads 106, only the wire bonding pads 106 connected to a specific power supply are illustrated. Note that the image capturing device 101 has a power source and the like of an analog system that necessitates a large amount of electric current, and to avoid deterioration of power supply, caused by the wiring in the image capturing device 101, the image capturing device 101 is provided with a plurality of inputs. Therefore, the wire bonding pads 16 are arranged at a plurality of locations.

The imaging substrate 102 is provided with a power supply wiring 201 for supplying electric power from a power source, not shown, to the image capturing device 101 via the connector 103. In FIG. 13, the power supply wiring 201 is arranged to extend from an area on which the connector 103 is mounted (which is an area forming a contact point brought into contact with the connector 103 and is hereinafter referred to as the "power supply connection portion"), toward the left end of the imaging substrate 102.

In the following description, part of the wiring drawn out from the power supply connection portion toward the end of the imaging substrate 102 is referred to as the "draw-out wiring portion", and described as the "draw-out wiring portion 201A" for convenience of explanation. Note that the definition that the part drawn out from the power supply connection portion toward the substrate end is referred to as the draw-out wiring portion is similarly applied to power supply wirings according to the embodiments of the present invention described hereafter and conventional power supply wirings described for comparison.

The power supply wiring 201 is further routed from the draw-out wiring portion 201A in an area corresponding to the vicinity of the outer periphery of the image capturing device 101, as viewed in the direction perpendicular to the imaging surface of the image capturing device 101. Part of the power supply wiring 201, arranged along the outer periphery of the image capturing device 101, is hereafter referred to as the "outer peripheral wiring portion" for convenience of explanation. The outer peripheral wiring portion is electrically connected to the wire bonding pads 106 at a plurality of locations.

Electric current flowing through the power supply wiring 201 varies with current variation in loads connected to the power supply wiring 201. Further, a wiring portion drawn out from the connector 103 is part of the power supply wiring 201 where the electric current concentrates. Therefore, as in the case of the power supply wiring 201, only one wiring portion (the draw-out wiring portion 201A) is drawn out from the connector 103 (power supply connection portion), electric current flowing therethrough varies with current variation in all loads of the image capturing device 101 connected to the power supply wiring 201. As a result, magnetic noise is liable to be generated due to variation in electric current flowing through the draw-out wiring portion 201A.

Figure 9A:
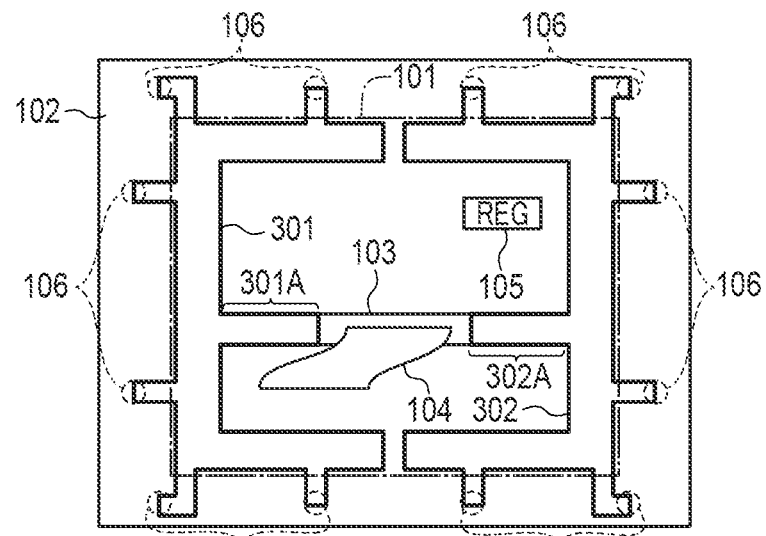
FIGS. 9A to 9C are views showing power supply wiring patterns on an imaging substrate of the fifth embodiment, respectively.
Figure 9B:
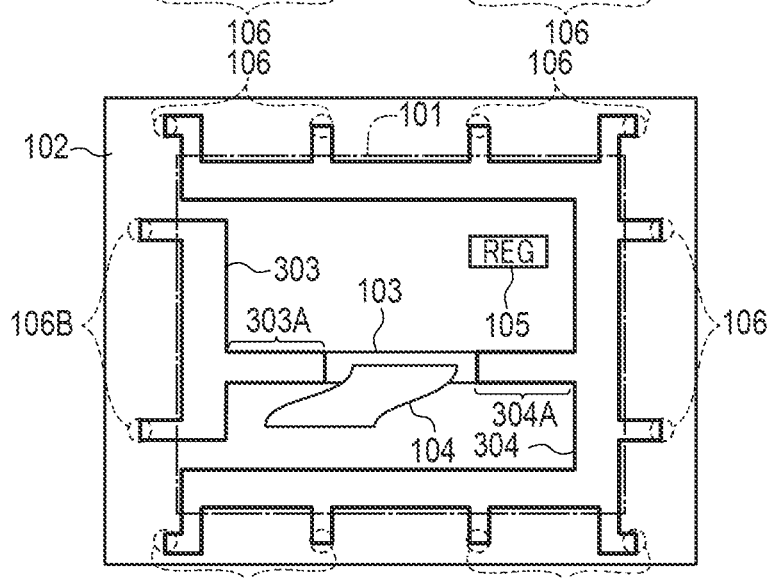
Figure 9C:
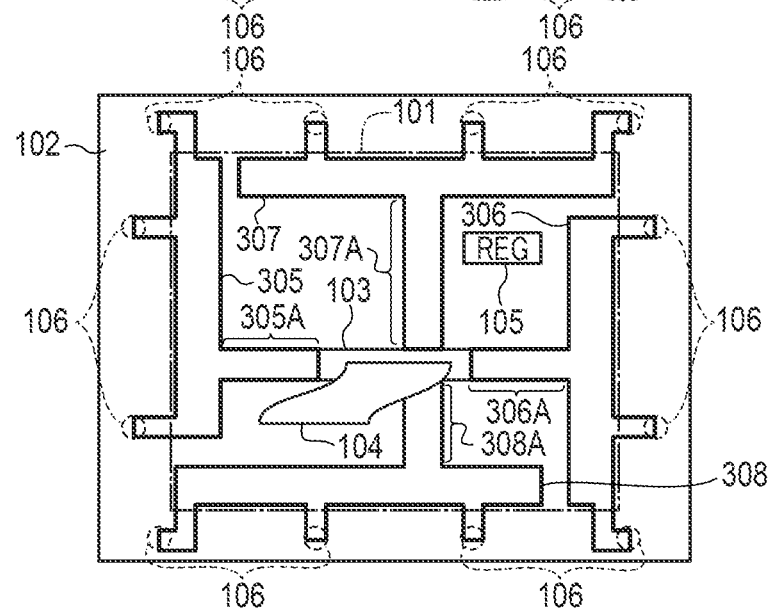

To solve this problem, in the image capturing device unit according to the present embodiment, as described hereafter with reference to FIGS. 9A to 9C, the power supply wiring is provided in a state divided into a plurality of power supply wirings to thereby reduce current variation in the power supply wirings (particularly, in the draw-out wiring portion).

FIGS. 9A to 9C are views showing examples of the power supply wiring pattern on the imaging substrate 102, and each show the surface of the imaging substrate 102 on which the connector 103 is mounted, similar to FIG. 13. FIG. 9A is a view showing a first example of the power supply wiring pattern for supplying power to the image capturing device 101. The power supply wiring shown in FIG. 9A has a first power supply wiring 301 and a second power supply wiring 302.

In FIG. 9A, the first power supply wiring 301 is routed from the power supply connection portion as the contact point brought into contact with the connector 103, toward the left end of the imaging substrate 102, and then routed to an area corresponding to the vicinity of the outer periphery of the image capturing device 101, as viewed in the direction perpendicular to the imaging surface of the image capturing device 101.

A portion of the first power supply wiring 301, which extends from the connector 103 (power supply connection portion) toward the left end of the imaging substrate 102, is hereinafter referred to as the "first draw-out wiring portion 301A". Further, a portion of the first power supply wiring 301, which extends along the outer periphery of the image capturing device 101, is referred to as the "first outer peripheral wiring portion". The first draw-out wiring portion 301A is part of the first power supply wiring 301, where the electric current concentrates.

In FIG. 9A, the second power supply wiring 302 is routed from the power supply connection portion as the contact point brought into contact with the connector 103, toward the right end of the imaging substrate 102, and then routed to an area corresponding to the vicinity of the outer periphery of the image capturing device 101, as viewed in the direction perpendicular to the imaging surface of the image capturing device 101.

A portion of the second power supply wiring 302, which extends from the connector 103 (power supply connection portion) toward the right end of the imaging substrate 102 in FIG. 9A is hereinafter referred to as the "second draw-out wiring portion 302A". Further, a portion of the second power supply wiring 302, which extends along the outer periphery of the image capturing device 101, is referred to as the "second outer peripheral wiring portion". The second draw-out wiring portion 302A is part of the second power supply wiring 302, where the electric current concentrates.

Power is supplied to all of the wire bonding pads 106 through the first power supply wiring 301 and the second power supply wiring 302. Note that in a case where the imaging substrate 102 has a multi-layer structure, to minimize the influence of magnetic noise generated by the first power supply wiring 301 and the second power supply wiring 302, on the image capturing device 101, it is desirable that the first power supply wiring 301 and the second power supply wiring 302 are arranged in a layer far from the image capturing device 101.

In the conventional power supply wiring pattern shown in FIG. 13, the loads of the image capturing device 101 are all connected to the power supply wiring 201. On the other hand, in the case where the power supply wiring pattern is provided on the imaging substrate 102 in a state divided into the first power supply wiring 301 and the second power supply wiring 302 as in the present embodiment, the loads of the image capturing device 101 are divided between the first power supply wiring 301 and the second power supply wiring 302. As a result, the respective totals of loads of the image capturing device 101 connected to the first power supply wiring 301 and the second power supply wiring 302, respectively, each become smaller than the total of loads of the image capturing device 101, which are connected to the power supply wiring 201 in FIG. 13. Therefore, compared with the draw-out wiring portion 201A of the power supply wiring 201 in FIG. 13, it is possible to reduce the current variation in the first draw-out wiring portion 301A and the second draw-out wiring portion 302A.

It is desirable that the direction of drawing out the second draw-out wiring portion 302A from the connector 103 (hereinafter referred to as the "draw-out direction") is different from the direction of drawing out the first draw-out wiring portion 301A from the connector 103. This is because magnetic fields in the same direction become stronger by being superimposed on each other, and hence if magnetic fields in the same direction are generated, the influence of magnetic noise on a captured image (image signals) lowers image quality. Further, it is desirable that an angle formed by the direction of drawing out the second draw-out wiring portion 302A from the connector 103 and the direction of drawing out the first draw-out wiring portion 301A from the connector 103 is equal to 90 degrees or more. This is because magnetic fields perpendicular to each other do not interfere with each other and magnetic fields in opposite directions cancel each other, and hence lowering of the image quality of a captured image caused by magnetic noise can be effectively suppressed.

For these reasons, the first draw-out wiring portion 301A and the second draw-out wiring portion 302A are drawn out from the connector 103 in the opposite directions. This makes it possible to reduce superimposition of magnetic fields generated due to current variation in the first draw-out wiring portion 301A and the second draw-out wiring portion 302A to the minimum, and thereby reduce lowering of image quality of a captured image caused by the influence of magnetic noise to the minimum.

It is desirable that the first power supply wiring 301 and the second power supply wiring 302 are arranged such that they are approximately equal to each other in variation in load current flowing therethrough, and a wiring example in this case will be described with reference to FIG. 9B.

FIG. 9B is a view showing a second example of the power supply wiring pattern for supplying power to the image capturing device 101. The power supply wiring shown in FIG. 9B is the wiring example in a case where variation in load current at two wire bonding pads 106B located toward the center of the left end of the imaging substrate 102 is larger than that at the other wire bonding pads 106, and has a first power supply wiring 303 and a second power supply wiring 304.

The first power supply wiring 303 is routed from the connector 103 and is connected only to the two wire bonding pads 106B large in load variation. The second power supply wiring 304 is routed from the connector 103 and is connected to the wire bonding pads 106 other than the two wire bonding pads 106B. With this arrangement, the first power supply wiring 303 and the second power supply wiring 304 become approximately equal to each other in variation in load current flowing therethrough, whereby it is possible to efficiently reduce the current variation in a first draw-out wiring portion 303A and a second draw-out wiring portion 304A. As a result, it is possible to reduce lowering of image quality of a captured image caused by magnetic noise generated by the first power supply wiring 303 and the second power supply wiring 304 routed from the connector 103.

Incidentally, one or a plurality of supplementary wirings for supplying power for the same use as that of the first power supply wiring 301 and the second power supply wiring 302 may be drawn out from the connector 103 and be arranged separately from the first power supply wiring 301 and the second power supply wiring 302. An example of this wiring will be described with reference to FIG. 9C.

FIG. 9C is a view showing a third example of the power supply wiring pattern for supplying power to the image capturing device 101. The power supply wiring shown in FIG. 9C has not only a first power supply wiring 305 and a second power supply wiring 306, but also a third power supply wiring 307 and a fourth power supply wiring 308 as supplementary wirings.

In FIG. 9C, the third power supply wiring 307 is routed from the power supply connection portion as the contact point brought into contact with the connector 103, toward the upper end of the imaging substrate 102, and then routed to an area corresponding to the vicinity of the outer periphery of the image capturing device 101, as viewed in the direction perpendicular to the imaging surface of the image capturing device 101. Further, in FIG. 9C, the fourth power supply wiring 308 is routed from the power supply connection portion as the contact point brought into contact with the connector 103, toward the lower end of the imaging substrate 102, and then routed to an area corresponding to the vicinity of the outer periphery of the image capturing device 101, as viewed in the direction perpendicular to the imaging surface of the image capturing device 101.

In the following description, a portion of the third power supply wiring 307, which extends from the connector 103 (power supply connection portion) toward the upper end of the imaging substrate 102, is referred to as the "third draw-out wiring portion 307A". Further, a portion of the fourth power supply wiring 308, which extends from the connector 103 (power supply connection portion) toward the lower end of the imaging substrate 102, is referred to as the "fourth draw-out wiring portion 308A".

In the power supply wiring pattern shown in FIG. 9C, the loads of the image capturing device 101 are divided among the four power supply wirings of the first power supply wiring 305 to the fourth power supply wiring 308. As a result, the respective totals of loads of the image capturing device 101, which are connected to the first power supply wiring 305 to the fourth power supply wiring 308, each become smaller than the respective totals of loads of the image capturing device 101, which are connected to the first power supply wiring 301 and the second power supply wiring 302 in FIG. 9A.

Therefore, compared with current variation in the first draw-out wiring portion 301A and the second draw-out wiring portion 302A, it is possible to reduce the current variation in a first draw-out wiring portion 305A, a second draw-out wiring portion 306A, the third draw-out wiring portion 307A, and the fourth draw-out wiring portion 308A. This makes it possible to further reduce lowering of image quality of a captured image caused by magnetic noise generated by the power supply wirings routed from the connector 103.

Note that in a case where the three or more power supply wirings are drawn out from the connector 103 as in the power supply wiring pattern shown in FIG. 9C, it is desirable to arrange the wiring such that an angle formed by the directions of drawing out any two selected draw-out wiring portions from the connector 130 becomes equal to 90 degrees or more. Further, in a case where a supplementary wiring or supplementary wirings is/are used, it is possible to reduce the current variation in each draw-out wiring portion, but the area of wiring portions causing magnetic noise increases. For this reason, it is desirable that the supplementary wiring(s) is/are provided only in a case where the influence of magnetic noise on a captured image becomes small, by taking into account the total area of wiring portions on the imaging substrate 102.

As described above, in the fifth embodiment, the power supply wiring provided on the imaging substrate 102 is drawn out from the power supply connection portion as the contact point brought into contact with the connector 103 in a state divided into a plurality of power supply wirings. This makes it possible to reduce current variation in the power supply wirings to thereby reduce lowering of image quality caused by magnetic noise generated by the power supply wirings.

Figure 14:
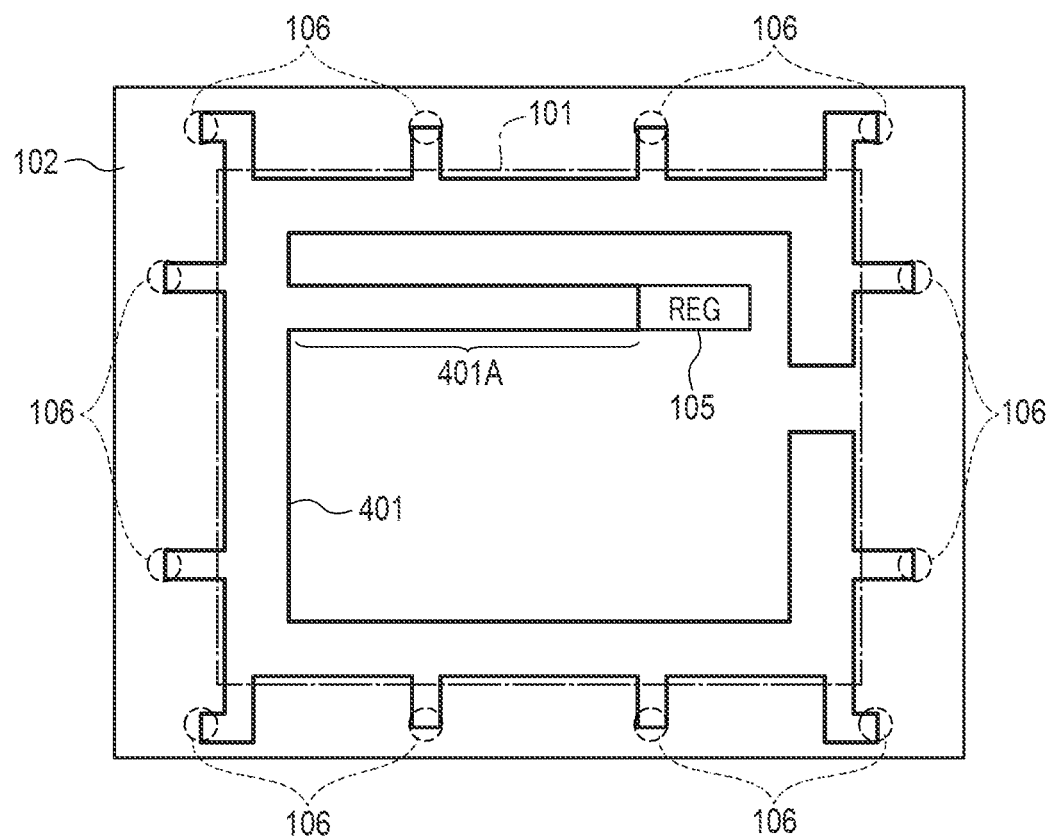
FIG. 14 is a view showing another example of the power supply wiring pattern on the conventional imaging substrate.

Before describing the power supply wiring pattern according to a sixth embodiment, another example of the conventional power supply wiring pattern will be described. FIG. 14 is a view showing another example of the power supply wiring pattern arranged on the imaging substrate of the conventional image capturing device unit.

Note that the conventional image capturing device unit shown in FIG. 14 differs from the image capturing device unit according to the fifth embodiment, shown in FIG. 8, only in the power supply wiring pattern arranged on the imaging substrate. Therefore, out of the component elements of the conventional image capturing device unit shown in FIG. 14, as for the same components as those of the image capturing device unit according to the fifth embodiment, shown in FIG. 8, a description will be given using the same names and reference numerals as those of the image capturing device unit according to the fifth embodiment, shown in FIG. 8.

FIG. 14 shows the same surface as the surface of the imaging substrate 102 shown in FIG. 8, on which the electronic component 105 is mounted, and the image capturing device 101 and the wire bonding pads 106 are mounted on a surface different from the surface on which the electronic component 105 is mounted. Further, similar to FIG. 13, in FIG. 14, out of the plurality of wire bonding pads 106, only the wire bonding pads 106 connected to a specific power source are illustrated. Note that the power supply wiring between the connector 103 and the electronic component 105 is not shown.

Here, the electronic component 105 is a linear regulator for generating a predetermined voltage. The imaging substrate 102 is provided with the power supply wiring 401 for supplying power from the electronic component 105 to the image capturing device 101. A draw-out wiring portion 401A drawn out from the power supply connection portion as a contact point where the power supply wiring 401 is brought into contact with the electronic component 105, toward an end of the imaging substrate 102 is part where electric current concentrates in the power supply wiring 401.

The current variation in the power supply wiring 401 is determined depending on current variation in loads connected to the power supply wiring 401. As in the case of the power supply wiring 401, when only one wiring portion (the draw-out wiring portion 401A) is drawn out from the connector 103 (power supply connection portion), electric current flowing through the draw-out wiring portion 401A largely varies with current variation according to all of the loads of the image capturing device 101 connected to the power supply wiring 401.

Figure 10A:
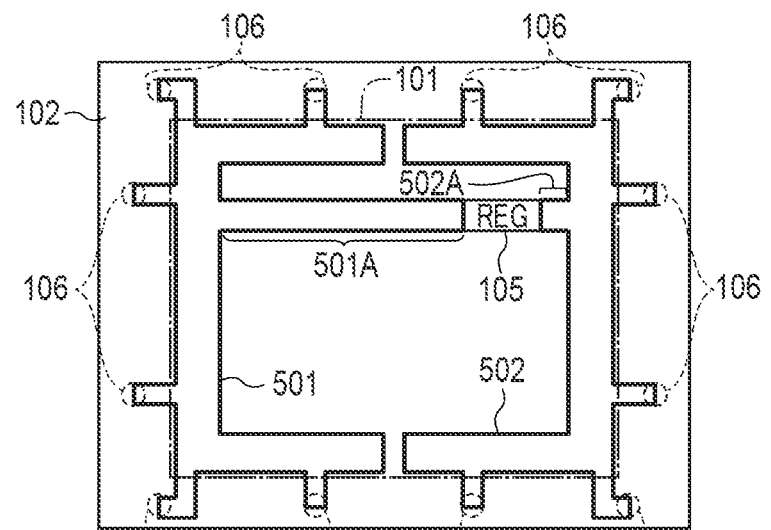
FIGS. 10A to 10C are views showing power supply wiring patterns on an imaging substrate of a sixth embodiment, respectively.
Figure 10B:
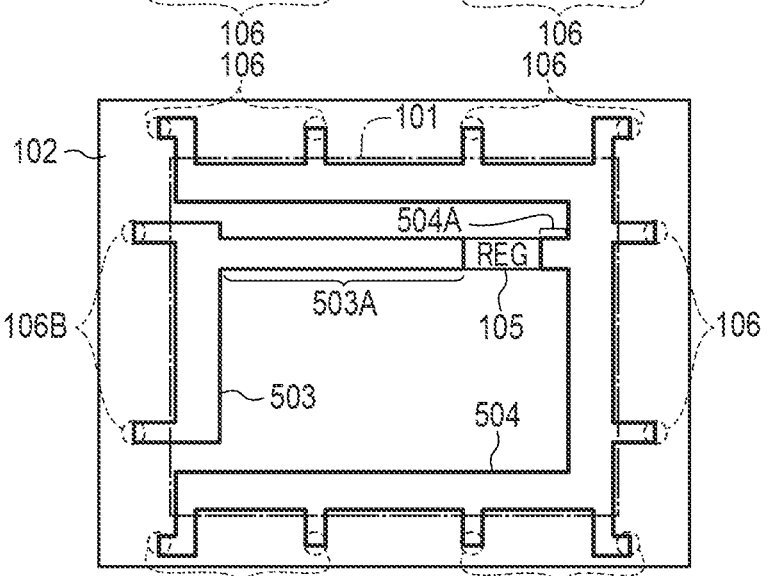
Figure 10C:
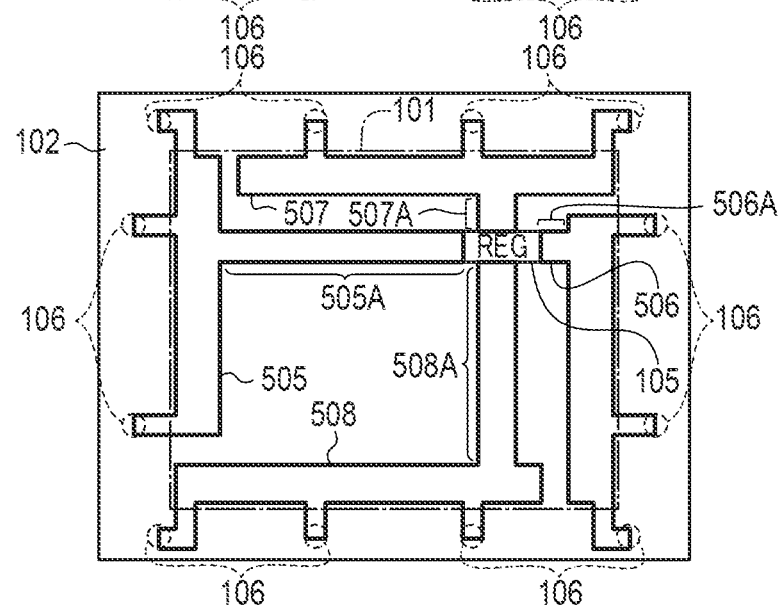

To cope with this problem, in the image capturing device unit according to the sixth embodiment, as described hereafter with reference to FIGS. 10A to 10C, the power supply wiring routed from the electronic component 105 is provided in a state divided into a plurality of power supply wirings to thereby reduce current variation in each power supply wiring. Note that the image capturing device unit according to the sixth embodiment as well differs from the image capturing device unit according to the fifth embodiment, shown in FIG. 8, only in the power supply wiring pattern arranged on the imaging substrate. Therefore, the same components as those of the image capturing device unit according to the fifth embodiment, shown in FIG. 8, will be described using the same names and reference numerals as those of the image capturing device unit according to the fifth embodiment, shown in FIG. 8.

FIGS. 10A to 10C are views showing other examples of the power supply wiring pattern on the imaging substrate 102, and, similar to FIGS. 9A to 9C, each show the surface of the imaging substrate 102, on which the electronic component 105 is mounted. FIG. 10A is a view showing a fourth example of the power supply wiring pattern for supplying power to the image capturing device 101. The power supply wiring pattern shown in FIG. 10A has a first power supply wiring 501 and a second power supply wiring 502.

In FIG. 10A, the first power supply wiring 501 is routed from the power supply connection portion as the contact point brought into contact with the electronic component 105, toward the left end of the imaging substrate 102, and then routed to an area corresponding to the vicinity of the outer periphery of the image capturing device 101, as viewed in the direction perpendicular to the imaging surface of the image capturing device 101. Further, in FIG. 10A, the second power supply wiring 502 is routed from the power supply connection portion as the contact point brought into contact with the connector 103, toward the right end of the imaging substrate 102, and then routed to an area corresponding to the vicinity of the outer periphery of the image capturing device 101, as viewed in the direction perpendicular to the imaging surface of the image capturing device 101. A first draw-out wiring portion 501A of the first power supply wiring 501 is part where the electric current of the first power supply wiring 501 concentrates, and a second draw-out wiring portion 502A of the second power supply wiring 502 is part where the electric current of the second power supply wiring 502 concentrates.

Power is supplied to all of the wire bonding pads 106 by the first power supply wiring 501 and the second power supply wiring 502. Note that in a case where the imaging substrate 102 has a multi-layer structure, to minimize the influence of magnetic noise generated by the first power supply wiring 501 and the second power supply wiring 502, on the image capturing device 101, it is desirable that the first power supply wiring 501 and the second power supply wiring 502 are arranged in a layer far from the image capturing device 101.

In the conventional power supply wiring pattern shown in FIG. 14, the loads of the image capturing device 101 are all connected to the power supply wiring 401. In contrast, in a case where the power supply wiring is provided on the imaging substrate 102 in a state divided into the first power supply wiring 501 and the second power supply wiring 502, the loads of the image capturing device 101 are divided between the first power supply wiring 501 and the second power supply wiring 502. Therefore, the respective totals of loads of the image capturing device 101, which are connected to the first power supply wiring 501 and the second power supply wiring 502, each become smaller than the total of loads of the image capturing device 101 connected to the power supply wiring 401. Therefore, compared with the draw-out wiring portion 401A of the power supply wiring 401 in FIG. 14, it is possible to reduce the current variation in the first draw-out wiring portion 501A and the second draw-out wiring portion 502A.

It is desirable that the direction of drawing out the second draw-out wiring portion 502A from the electronic component 105 is different from the direction of drawing out the first draw-out wiring portion 501A from the electronic component 105. This is because magnetic fields in the same direction become stronger by being superimposed on each other, and hence if magnetic fields in the same direction are generated, the influence of magnetic noise on a captured image (image signals) lowers image quality. Further, it is desirable that an angle formed by the direction of drawing out the second draw-out wiring portion 502A from the electronic component 105 and the direction of drawing out the first draw-out wiring portion 501A from the electronic component 105 is equal to 90 degrees or more. This makes it possible to further reduce the influence of magnetic noise on a captured image to thereby suppress lowering of image quality of a capture image caused by magnetic noise.

For these reasons, the first draw-out wiring portion 501A and the second draw-out wiring portion 502A are drawn out from the electronic component 105 in the opposite directions. This makes it possible to reduce superimposition of magnetic fields generated due to current variation in the first draw-out wiring portion 501A and the second draw-out wiring portion 502A to the minimum, and thereby reduce lowering of image quality of a captured image caused by magnetic noise to the minimum.

It is desirable that the first power supply wiring 501 and the second power supply wiring 502 are arranged such that they are approximately equal to each other in variation in load current flowing therethrough, and a wiring example in this case will be described with reference to FIG. 10B.

FIG. 10B is a view showing a fifth example of the power supply wiring pattern for supplying power to the image capturing device 101. The power supply wiring shown in FIG. 10B is the wiring example in a case where variation in load current at two wire bonding pads 106B located toward the center of the left end of the imaging substrate 102 is larger than that at the other wire bonding pads 106, and has a first power supply wiring 503 and a second power supply wiring 504.

The first power supply wiring 503 is routed from the electronic component 105 and is connected only to the two wire bonding pads 106B large in load variation. The second power supply wiring 504 is routed from the electronic component 105 and is connected to the wire bonding pads 106 other than the two wire bonding pads 106B. With this arrangement, the first power supply wiring 503 and the second power supply wiring 504 become approximately equal to each other in variation in load current flowing therethrough, whereby it is possible to efficiently reduce the current variation in a first draw-out wiring portion 503A and a second draw-out wiring portion 504A. As a result, it is possible to reduce the influence of magnetic noise generated by the first power supply wiring 503 and the second power supply wiring 504 routed from the electronic component 105, on a captured image.

Incidentally, one or a plurality of supplementary wirings for supplying power for the same use as those of the first power supply wiring 501 and the second power supply wiring 502 may be drawn out from the electronic component 105 and be arranged separately from the first power supply wiring 501 and the second power supply wiring 502. An example of this wiring will be described with reference to FIG. 9C.

FIG. 10C is a view showing a sixth example of the power supply wiring pattern for supplying power to the image capturing device 101. The power supply wiring pattern shown in FIG. 10C has not only a first power supply wiring 505 and a second power supply wiring 506, but also a third power supply wiring 507 and a fourth power supply wiring 508 as the supplementary wirings.

In FIG. 10C, the third power supply wiring 507 is routed from the power supply connection portion as the contact point brought into contact with the electronic component 105, toward the upper end of the imaging substrate 102, and then routed to an area corresponding to the vicinity of the outer periphery of the image capturing device 101, as viewed in the direction perpendicular to the imaging surface of the image capturing device 101. Further, in FIG. 10C, the fourth power supply wiring 508 is routed from the power supply connection portion as the contact point brought into contact with the electronic component 105, toward the lower end of the imaging substrate 102, and then routed to an area corresponding to the vicinity of the outer periphery of the image capturing device 101, as viewed in the direction perpendicular to the imaging surface of the image capturing device 101.

In the power supply wiring pattern shown in FIG. 10C, the loads of the image capturing device 101 are divided among the four power supply wirings of the first power supply wiring 505 to the fourth power supply wiring 508. As a result, the respective totals of loads of the image capturing device 101, which are connected to the first power supply wiring 505 to the fourth power supply wiring 508, each become smaller than the respective totals of loads of the image capturing device 101, which are connected to the first power supply wiring 501 and the second power supply wiring 502 in FIG. 10A.

Therefore, compared with current variation in the first draw-out wiring portion 501A and the second draw-out wiring portion 502A, it is possible to reduce the current variation in a first draw-out wiring portion 505A, a second draw-out wiring portion 506A, a third draw-out wiring portion 507A, and a fourth draw-out wiring portion 508A. This makes it possible to further suppress lowering of image quality of a captured image caused by magnetic noise generated by the power supply wirings routed from the electronic component 105.

Note that in a case where a supplementary wiring or supplementary wirings is/are used, it is possible to reduce the current variation in each draw-out wiring portion, but the area of wiring portions causing magnetic noise increases. For this reason, it is desirable that the supplementary wiring(s) is/are provided only in a case where the influence of magnetic noise on a captured image becomes small, by taking into account the total area of wiring portions on the imaging substrate 102.

As described above, in the sixth embodiment, the power supply wiring provided on the imaging substrate 102 is drawn out from the electronic component 105 (the power supply connection portion) in a state divided into a plurality of power supply wirings. This makes it possible to reduce current variation in the power supply wirings to thereby reduce the influence of magnetic noise generated by the power supply wirings, on the image capturing device 101 (captured image).

In the fifth embodiment and the sixth embodiment, the description is given of the power supply wiring pattern arranged on the imaging substrate. In contrast, in a seventh embodiment, the power supply wiring pattern arranged within the image capturing device will be described.

Figure 11:
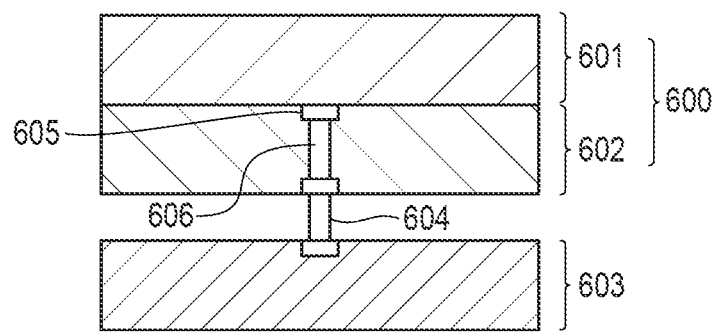
FIG. 11 is a cross-sectional view showing a schematic configuration of part of an image capturing device unit according to a seventh embodiment.

FIG. 11 is a cross-sectional view showing a schematic configuration of part of an image capturing device unit according to the seventh embodiment. The image capturing device unit includes an image capturing device 600 and an imaging substrate 603. The image capturing device 600 includes a light receiving layer 601, a signal processing layer 602, and a connector 605.

The light receiving layer 601 includes a pixel portion for outputting image signals according to incident light. The signal processing layer 602 includes a signal processing circuit, not shown, for processing signals output from the light receiving layer 601. The imaging substrate 603 is a printed circuit board on which the image capturing device 600 is mounted. It is desirable that the imaging substrate 603 is a rigid substrate so as to mount the image capturing device 600 and is formed of e.g. glass epoxy. However, this is not limitative, but the imaging substrate 603 may be a flexible substrate using a plastic material, or a LTCC (Low-Temperature Co-Fire Ceramics) substrate using ceramics and copper wiring. That is, the imaging substrate 102 is only required to be a substrate which is made by forming a metallic wiring pattern of copper or the like on a specific material and on which components can be mounted.

The imaging substrate 603 and the signal processing layer 602 are connected by micro-bumps 604 or the like, and power and signals are supplied to the connector 605 via a wiring 606 formed as a through electrode within the signal processing layer 602. Then, the power is supplied from the connector 605 to the light receiving layer 601 and the signal processing layer 602 via a power supply wiring, not shown.

Figure 15:
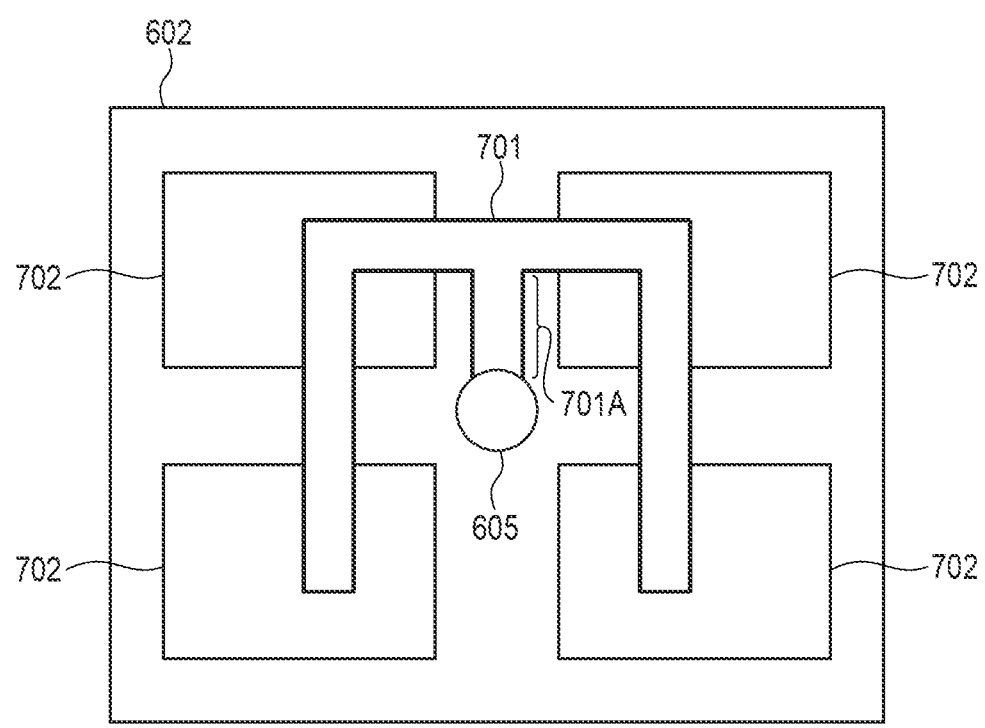
FIG. 15 is a view showing an example of a power supply wiring pattern in a conventional image capturing device.

Here, an example of the conventional power supply wiring pattern arranged in the signal processing layer 602 will be described. FIG. 15 is a view showing an example of the conventional power supply wiring pattern arranged on the signal processing layer 602, and shows a surface of the signal processing layer 602 described with reference to FIG. 11, which is brought into contact with the light receiving layer 601. The signal processing layer 602 is formed with a power supply wiring 701 for supplying power to the light receiving layer 601 and the signal processing layer 602. The signal processing layer 602 is provided with a plurality of signal processing circuits 702, and the signal processing circuits 702 each have a predetermined function, such as DFE (Decision Feedback Equalization) and analog-to-digital conversion.

The power supply wiring 701 is formed such that it is drawn out from the connector 605 toward one end of the signal processing layer 602, and then routed so as to be connected to the plurality of signal processing circuits 702. The current variation in the power supply wiring 701 is determined depending on current variation in loads connected to the power supply wiring 701. As in the case of the power supply wiring 701, when only one wiring portion (a draw-out wiring portion 701A) is drawn out from the connector 605 (power supply connection portion), electric current flowing through the draw-out wiring portion 701A largely varies with current variation in loads of the light receiving layer 601 and all the signal processing circuits 702 connected to the power supply wiring 701.

Figure 12A:
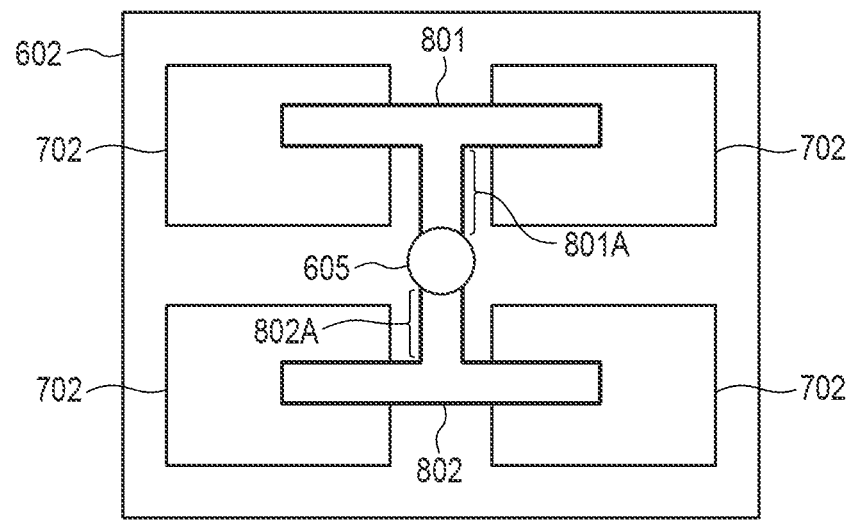
FIGS. 12A to 12C are views showing power supply wiring patterns in an image capturing device of the seventh embodiment, respectively.
Figure 12B:
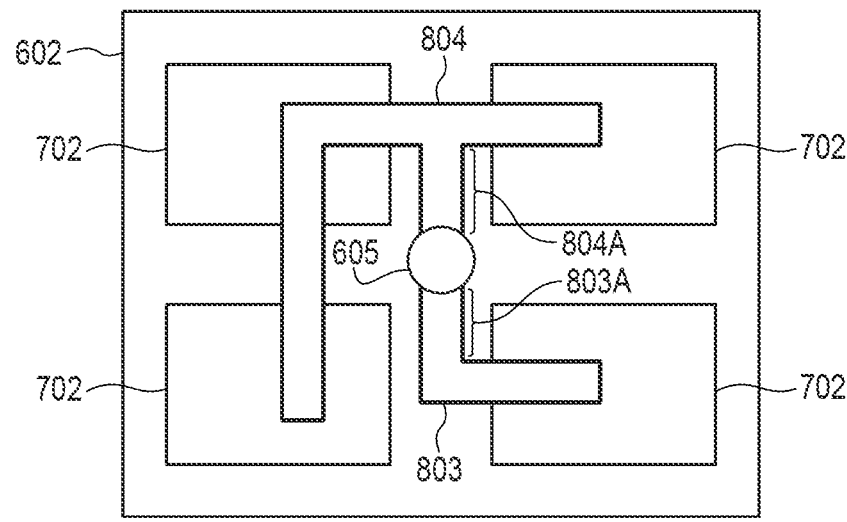
Figure 12C:
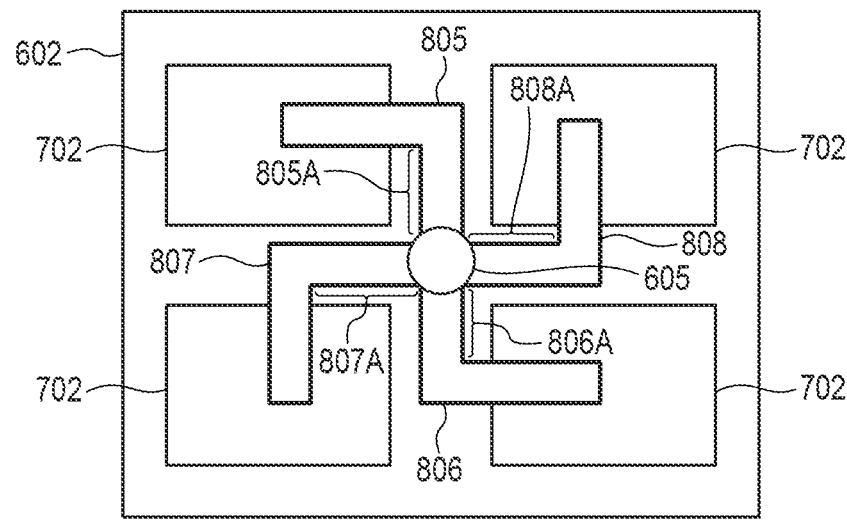

To cope with this problem, in the image capturing device unit according to the present embodiment, as described hereafter with reference to FIGS. 12A to 12C, the power supply wiring is provided in a state divided into a plurality of power supply wirings to thereby reduce the current variation in each of the power supply wirings.

FIGS. 12A to 12C are views showing examples of the power supply wiring pattern on the signal processing layer 602, and, similar to FIG. 15, each show the surface of the signal processing layer 602 in contact with the light receiving layer 601. FIG. 12A is a view showing a seventh example of the power supply wiring pattern. The power supply wiring pattern shown in FIG. 12A has a first power supply wiring 801 and a second power supply wiring 802, arranged in the signal processing layer 602, for supplying power to the light receiving layer 601 and the signal processing circuits 702.

In FIG. 12A, the first power supply wiring 801 is drawn out from a contact point (power supply connection portion) brought into contact with the connector 605, toward an upper end of the signal processing layer 602, and is connected to the two signal processing circuits 702. Further, the second power supply wiring 802 is drawn out from the contact point (power supply connection portion) brought into contact with the connector 605, toward a lower end of the signal processing layer 602, and is connected to the two signal processing circuits 702. Note that in a case where the signal processing layer 602 has a multi-layer structure, to minimize the influence of magnetic noise generated by the first power supply wiring 801 and the second power supply wiring 802, on the light receiving layer 601, it is desirable that the first power supply wiring 801 and the second power supply wiring 802 are arranged in a layer far from the light receiving layer 601.

In the conventional power supply wiring pattern shown in FIG. 15, the loads of the light receiving layer 601 and the signal processing circuits 702 are all connected to the power supply wiring 701. In contrast, in the case where the power supply wiring is provided on the signal processing layer 602 in a state divided into the first power supply wiring 801 and the second power supply wiring 802, the loads of the light receiving layer 601 and the signal processing circuits 702 are divided between the first power supply wiring 801 and the second power supply wiring 802. As a result, the respective totals of loads of the light receiving layer 601 and the signal processing circuits 702, which are connected to the first power supply wiring 801 and the second power supply wiring 802, each become smaller than the total of loads of the light receiving layer 601 and the signal processing circuits 702, connected to the power supply wiring 701. Therefore, compared with the draw-out wiring portion 701A of the power supply wiring 701 appearing in FIG. 15, it is possible to reduce current variation in each of a first draw-out wiring portion 801A and a second draw-out wiring portion 802A.

It is desirable that the direction of drawing out the second draw-out wiring portion 802A from the connector 605 is different from the direction of drawing out the first draw-out wiring portion 801A from the connector 605. Further, it is desirable that the an angle formed by the direction of drawing out the second draw-out wiring portion 802A from the connector 605 and the direction of drawing out the first draw-out wiring portion 801A from the connector 605 is equal to 90 degrees or more. Taking these into consideration, the first draw-out wiring portion 801A and the second draw-out wiring portion 802A are drawn out from the connector 605 in opposite directions. This is because it is possible to more reduce lowering of image quality of a captured image caused by magnetic noise.

It is desirable that the first power supply wiring 801 and the second power supply wiring 802 are arranged such that they are approximately equal to each other in variation in load current flowing therethrough, and a wiring example in this case will be described with reference to FIG. 12B.

FIG. 12B is a view showing an eighth example of the power supply wiring pattern, which is the wiring example in a case where load variation in the signal processing circuit 702 in the lower right, as viewed in FIG. 12A, is larger than in the other three signal processing circuits 702. The power supply wiring shown in FIG. 12B has a first power supply wiring 803 and a second power supply wiring 804 arranged in the signal processing layer 602.

The first power supply wiring 803 is routed from the connector 605 and is connected only to the signal processing circuit 702 in the lower right, which is large in load variation. The second power supply wiring 804 is routed from the connector 605 and is connected to the other signal processing circuits 702 to which the first power supply wiring 803 is not connected. With this arrangement, the first power supply wiring 803 and the second power supply wiring 804 become approximately equal to each other in variation in load current flowing therethrough, whereby it is possible to efficiently reduce current variation in each of a first draw-out wiring portion 803A and a second draw-out wiring portion 804A.

Incidentally, one or a plurality of supplementary wirings for supplying power for the same use as that of the first power supply wiring 801 and the second power supply wiring 802 may be drawn out from the connector 605 and be arranged, and an example of this wiring will be described with reference to FIG. 12C.

FIG. 12C is a view showing a ninth example of the power supply wiring pattern. The power supply wiring shown in FIG. 12C is arranged on the signal processing layer 602 and has not only a first power supply wiring 805 and a second power supply wiring 806, but also a third power supply wiring 807 and a fourth power supply wiring 808 as the supplementary wirings. In FIG. 12C, the third power supply wiring 807 is drawn out from the connector 605 toward the left and is then routed to the signal processing circuit 702 in the lower left, and the fourth power supply wiring 808 is drawn out from the connector 605 toward the right and is then routed to the signal processing circuit 702 in the upper right.

In the power supply wiring pattern shown in FIG. 12C, the loads of the light receiving layer 601 and the signal processing circuits 702 are divided among the first power supply wiring 805, the second power supply wiring 806, the third power supply wiring 807, and the fourth power supply wiring 808. As a result, the respective totals of loads of the light receiving layer 601 and the signal processing circuits 702, which are connected to the first power supply wiring 805 to the fourth power supply wiring 808, each become smaller than the respective totals of loads connected to the power supply wiring 801 and the second power supply wiring 802 in FIG. 12A. Therefore, compared with current variation in the draw-out wiring portion 801A and the second draw-out wiring portion 802A, it is possible to reduce current variation in each of a first draw-out wiring portion 805A, a second draw-out wiring portion 806A a third draw-out wiring portion 807A, and a fourth draw-out wiring portion 808A.

As described above, in the seventh embodiment, the power supply wiring provided on the signal processing layer 602 is drawn out from the connector 605 (the power supply connection portion) in a state divided into a plurality of power supply wirings. This makes it possible to reduce current variation in each power supply wiring to thereby reduce the influence of magnetic noise generated by the power supply wiring, on the light receiving layer 601.

Figure 16:
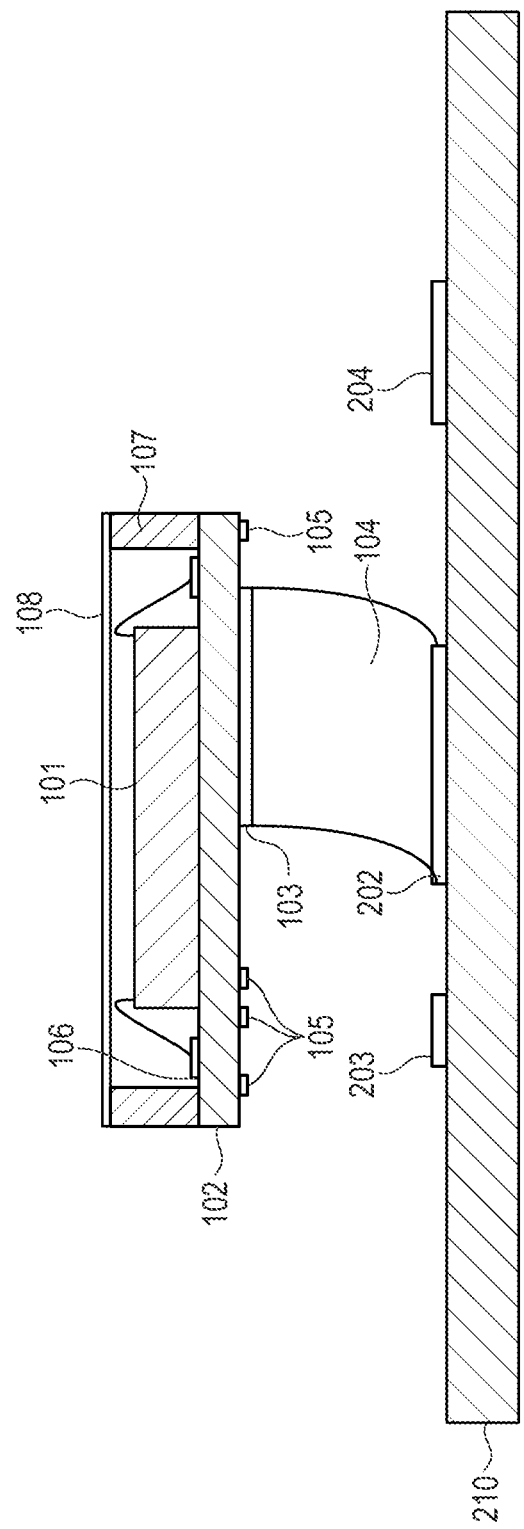
FIG. 16 is a cross-sectional view showing a schematic configuration of an image capturing device unit and a signal processing unit according to an eighth embodiment.

FIG. 16 is a cross-sectional view showing a schematic configuration of an image capturing device unit and a signal processing unit according to an eighth embodiment. The image capturing device unit includes the image capturing device 101, the imaging substrate 102, the connector 103, the flexible wiring board 104, the electronic components 105, the wire bonding pads 106, the frame portion 107, and the cover glass 108. The signal processing unit includes a signal processing substrate 210, a connector 202, a power supply IC 203, and a signal processing CPU 204.

The image capturing device 101 is e.g. a CMOS image sensor that outputs image signals according to incident light. Note that FIG. 16 shows a cross-section perpendicular to the imaging surface of the image capturing device 101, on which an optical image is formed. The image capturing device 101 is generally divided into a pixel block including photodiodes and the like, and a processing circuit block that performs analog-to-digital conversion and so forth.

In the CMOS image sensor, before reading out electric charges from the photodiodes, a downstream circuit and a pixel readout circuit for each pixel except the photodiode are reset. After this reset operation, only noise signals N of noise generated in the reset operation and the like are read out in a state in which the electric charges in the photodiodes have not been output to the downstream side circuits for the pixels. This operation of reading out the noise signals N is hereinafter referred to as the "N-reading".

Next, the electric charges accumulated in the photodiodes are output to the downstream side circuits for the pixels, and these pixel signals are read out as optical signals S. This operation of reading out the optical signals S is hereinafter referred to as the "S-reading". By subtracting the noise signals N read out by N-reading from the optical signals S read out by S-reading (hereinafter referred to as the "S-N operation"), the noise components can be eliminated from the pixel signals. Noise can be thus reduced by the S-N operation.

The imaging substrate 102 is a printed circuit board on which the image capturing device 101 and the like are mounted and which includes a power supply wiring formed of a metal, such as copper. A rigid substrate is preferably used for the imaging substrate 102 to mount the image capturing device 101, and for example, the imaging substrate 102 is formed of e.g. glass epoxy. However, this is not limitative, but the imaging substrate 102 may be a flexible substrate using a plastic material, or a LTCC (Low-Temperature Co-Fire Ceramics) substrate using ceramics and copper wiring. That is, the imaging substrate 102 is only required to be a substrate which is made by forming a metallic wiring pattern of copper or the like on a specific material and on which components can be mounted.

The connector 103 mounted on the imaging substrate 102 is a connection terminal having a plurality of contacts. The flexible wiring board 104 electrically connects between the connector 103 mounted on the imaging substrate 102 and the connector 202 mounted on the signal processing substrate 210. Although not shown, the connector 202 is connected to an external power source. The flexible wiring board 104 includes wiring lines (power supply wiring) for supplying power to the imaging substrate 102 (connector 103) via the signal processing substrate 210 (connector 202). Note that the flexible wiring board 104 may include wiring lines other than the wiring lines for supplying power, such as wiring lines for transmitting control signals and image signals output from the image capturing device 101.

The electronic components 105 are passive components including a capacitor, a resistor, and coils, and active components including a linear regulator that generates a predetermined voltage and an oscillator that generates a clock, which are necessary for operating the image capturing device 101. Note that the electronic components 105 may be components other than those for operating the image capturing device 101, such as a thermometer for monitoring the temperature of the image capturing device 101 and a ROM for storing individual information of the image capturing device 101.

A peripheral part of the imaging substrate 102 is fixed e.g. to a mechanical structural part, not shown, e.g. by bonding, and hence the electronic components 105 and the connector 103 are mostly arranged in the center or its vicinity of the imaging substrate 102.

Wire bonding pads 106 are electrodes formed, specifically by performing treatment, such as gold-plating, on a surface layer of the imaging substrate 102 so as to connect between the image capturing device 101 and the imaging substrate 102 e.g. by wire bonding. The wire bonding pads 106 are arranged on the same surface of the imaging substrate 102 on which the image capturing device 101 is mounted.

The frame portion 107 is formed on an outer periphery of the imaging substrate 102 such that it is adhered to the imaging substrate 102 and holds the cover glass 108. The cover glass 108 is a member for sealing the image capturing device 101 and is adhesively fixed to the frame portion 107. Note that the cover glass 108 has an antireflection film or the like formed thereon.

In the signal processing unit, the signal processing substrate 210 supplies power to and transmits and receives signals to and from the imaging substrate 102 via the flexible wiring board 104 that connects between the connector 202 mounted on the signal processing substrate 210 and the connector 103 mounted on the imaging substrate 102. The power supply IC 203 is connected to a power source, not shown, and generates power to be supplied to the imaging substrate 102. The power generated by the power supply IC 203 is supplied to the imaging substrate 102 via the connector 202, the flexible wiring board 104, and the connector 103. The signal processing CPU 204 receives signals output from the image capturing device 101 (image signals) via the flexible wiring board 104 and performs predetermined signal processing (image processing) thereon. Further, the signal processing CPU 204 outputs a drive signal for driving the image capturing device 101 (control signal) to the image capturing device 101.

Although in the present embodiment, the flexible wiring board 104 is used as a member for connecting between the imaging substrate 102 and the signal processing substrate 210, a thin-wire coaxial cable or the like may be used in place of this.

Before describing the configuration of the image capturing device unit according to the eighth embodiment, particularly the power supply wiring pattern arranged on the imaging substrate 102, an example of the conventional power supply wiring pattern will be described.

FIG. 21 is a view useful in explaining an example of the configuration of the conventional image capturing device unit. The conventional image capturing device unit shown in FIG. 21 differs from the image capturing device unit according to the eighth embodiment, described in detail hereinafter, in the arrangement of contacts (pins) of the connector mounted on the imaging substrate 102, and as a result, a location from which a power supply wiring is drawn out is different. Therefore, a connector as a component of the conventional image capturing device unit shown in FIG. 21, corresponding to the connector 103 as the component of the image capturing device unit shown in FIG. 16, is referred to as the "connector 903", and other components are described using the same names and reference numerals as those in FIG. 16.

Similar to FIG. 16, the upper left part in FIG. 21 shows a cross-section of the image capturing device unit, taken along a plane perpendicular to the imaging surface of the image capturing device 101. The lower left part in FIG. 21 shows the configuration of the image capturing device unit (projected surface), as viewed in the direction perpendicular to the imaging surface of the image capturing device 101, and shows the arrangement of pins (contacts) of the connector 903. The right part in FIG. 21 is a figure schematically showing a distribution of noises generated in the pixel area of the image capturing device 101 (hereinafter referred to as "image noises"), as viewed in the direction perpendicular to the imaging surface of the image capturing device 101.

The imaging substrate 102 has a power supply wiring 120 formed of metal, such as copper, arranged thereon. The power supply wiring 120 includes a wiring portion (hereinafter referred to as the "draw-out wiring portion 120A") drawn out from the connector 903 toward the right end of the imaging substrate 102, as viewed in FIG. 21. Further, the power supply wiring 120 includes a wiring portion (hereinafter referred to as the "outer peripheral wiring portion") which is branched from the draw-out wiring portion 120A and is formed along the outer periphery of the imaging substrate 102.

Note that the draw-out wiring portion 120A is formed such that it is routed from a portion corresponding to substantially the central portion of the connector 903 toward the right end of the imaging substrate 102. This is because pins V1, V2, V3, and V4 of the connector 903 are used for power supply. The power supply wiring 120 includes a plurality of wiring lines which are connected to the pins V1, V2, V3, and V4, respectively, of the plurality of pins of the connector 903, and are insulated from each other, for use in the supply of power. In FIG. 21, out of the plurality of pins of the connector 903, wiring lines connected to the pins other than those used for supply of power are omitted from illustration.

The power supply wiring 120 is routed from the connector 903, passes through the inner layer or the surface layer of the imaging substrate 102 and is connected to the wire bonding pad 106. The number of wire bonding pads 106 to which the power supply wiring 120 is connected is not limited to one, but may be plural. The power supply wiring 120 is electrically connected to the image capturing device 101 via wires connecting between the image capturing device 101 and the imaging substrate 102 (wire bonding pads 106).

An area 109 appearing in FIG. 21 expresses an area overlapping the image capturing device 101, as viewed in the direction perpendicular to the imaging surface of the image capturing device 101, and is hereinafter referred to as the "pixel projected area 109". Further, an area 110 appearing in FIG. 21 expresses an area outside the pixel projected area 109 on the imaging substrate 102 (hereinafter referred to as the "outside area 110"). Note that although in FIG. 21, the whole image capturing device 101 and the pixel area of the image capturing device 101 are illustrated as those having the same size, there is a case where a processing circuit block and the like other than the pixel area of the image capturing device 101 exist in the outside area 110.

As described above, noise reduction can be realized by the S-N operation in the image capturing device 101. However, N-reading and S-reading are different in sampling timing, and hence if electric current flowing through a power supply wiring line largely varies during the S-N operation, the magnetic field is generated with different magnitudes between respective sampling timings, resulting in an increase in the amount of noise.

Here, in a case where a power supply wiring is arranged within the pixel projected area 109 formed by projecting the pixel area of the image capturing device 101 onto the imaging substrate 102, the distance between the power supply wiring and the pixels of the image capturing device 101 is small. As a result, signals output from the pixels in the vicinity of the power supply wiring is significantly affected by a magnetic field generated by electric current flowing through the power supply wiring, whereby image noise is liable to be generated along the power supply wiring.

In the configuration shown in FIG. 21, the outer peripheral wiring portion of the power supply wiring 120 is formed in the outside area 110, and hence even when electric current flowing through the outer peripheral wiring portion varies, generation of image noise is substantially prevented. On the other hand, the draw-out wiring portion 120A is part where the wiring lines for supplying power to the image capturing device 101 are concentrated. Therefore, in a case where the draw-out wiring portion 120A is formed in the pixel projected area 109, image noise is liable to be generated in signals output from the pixels in the vicinity of the draw-out wiring portion 120A due to the influence of a magnetic field generated by electric current flowing through the draw-out wiring portion 120A.

Here, the pins V1 of the connector 903 are pins connected to ones, largest in current variation, of the power supply wiring lines for supplying power to the image capturing device 101. Therefore, image noise increases in part of the draw-out wiring portion 120A, where the power supply wiring lines connected to the pins V1 of the connector 903 are provided. As a result, as shown in the right part in FIG. 21, image noise appears in an image 901 along the draw-out wiring portion 120A. FIG. 21 schematically shows an area in the image 901, where the image noise appears, as an image noise-generating area 909.

To reduce the image noise-generating area 909, it is desirable to arrange the draw-out wiring portion 120A in the outside area 110 (eleventh embodiment). However, the location where the connector 903 is disposed is mostly limited due to a relationship with other components, and further, it is not easy to arrange the power supply wiring only in the outside area 110 also from a viewpoint of reducing the size of the image capturing device unit.

To cope with this, in the eighth embodiment, the image noise-generating area 909 is reduced by arranging the power supply wiring by using the connector 103 in which the arrangement of contacts (pins) of the connector 903 is changed for adjustment. The following description will be given mainly of the configuration of the connector 103.

Figure 17:
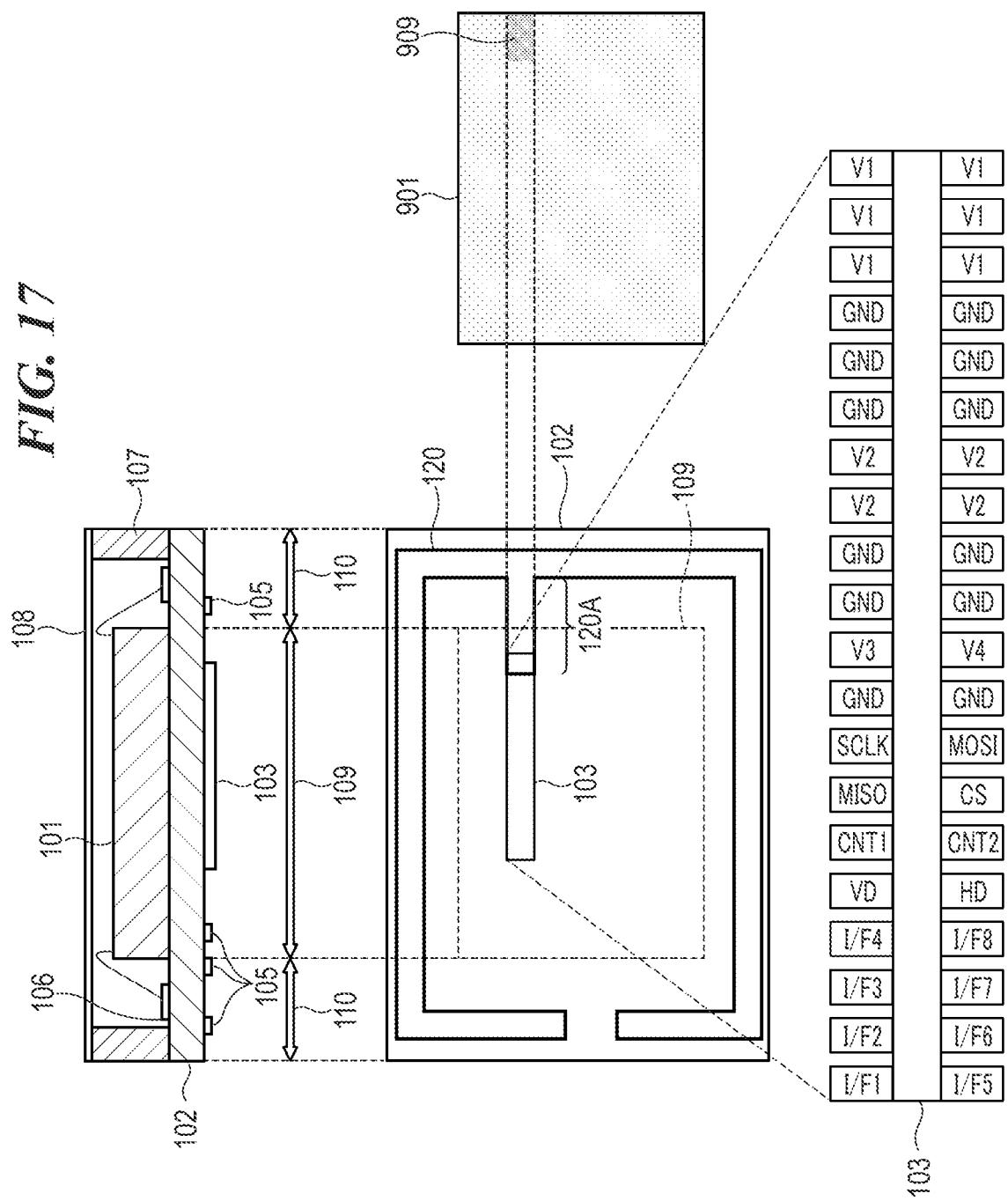
FIG. 17 is a view showing a schematic configuration of the image capturing device unit appearing in FIG. 16.

FIG. 17 is a view showing a schematic configuration of the image capturing device unit according to the eighth embodiment, and the image capturing device unit is depicted in a form similar to FIG. 21. The location on the imaging substrate 102, where the connector 103 is mounted, is the same as the location where the connector 903 is mounted in FIG. 21.

In a case where the connector 103 is arranged in the pixel projected area 109, image noise can be reduced by arranging the pins of the connector 103 as shown in FIG. 17. More specifically, the pins V1, V2, V3, and V4 of the connector 103 each are used for supplying power to the image capturing device 101, and the connector 103 has GND pins provided in association with respective ones of the pins for power supply, each for flow of a return current.

When the magnitudes of current variation in the power supply wiring lines connected to the pins V1 to V4 of the connector 903 can be expressed by using the reference numerals of the pins, as V1>V2>V3>V4. Here, as mentioned above, image noise generated along the power supply wiring 120 depends on current variation in the power supply wiring 120. Further, as the current variation is larger, the amount of noise appearing in an image is larger, and hence image noise tends to increase in the pixel area corresponding to the draw-out wiring portion.

In the connector 903 of the conventional image capturing device shown in FIG. 21, the pins V1 for power supply, which are so large in current variation as causes image noise to be generated, are arranged in the center or its vicinity of the connector 903. In this case, the distance from the pins V1 to the end of the imaging substrate 102 becomes long in the pixel projected area 109, so that the image noise-generating area 909 increases.

In contrast, in the connector 103 mounted on the imaging substrate 102 of the image capturing device unit in FIG. 17, the pins V1 to V4 connected to the wiring lines, which are large in current variation, are arranged sequentially inward from a location toward the end of the imaging substrate 102. This makes it possible to make the length of the draw-out wiring portion 120A in the configuration shown in FIG. 17 shorter than in the configuration shown in FIG. 21. Therefore, compared with the case where the connector 903 in FIG. 21 is mounted, it is possible to reduce the image noise-generating area 909 in the image 901, as shown in the right part in FIG. 17.

Note that pins SCLK, MOSI, MISO, and CS of the connector 103 are for serial communication between the image capturing device 101 and the signal processing CPU 204. The signal processing CPU 204 communicates with the image capturing device 101 via the pins and wiring lines for serial communication, and performs register setting, such as setting of the sensitivity of the image capturing device 101. Pins CNT1 and CNT2 are provided for a control signal for controlling the linear regulator (one of the electronic components 105) on the imaging substrate 102, and the control is performed from the signal processing CPU 204 on the signal processing substrate 210. Pins VD and HD are for a vertical synchronization signal and a horizontal synchronization signal for the image capturing device 101, respectively, and the control is performed from the signal processing CPU 204 on the signal processing substrate 210. Pins I/F1 to I/F8 are for signals output from the image capturing device 101, and are connected to the signal processing CPU 204 on the signal processing substrate 210. The locations of any of the pins for the signals (SCLK, MOSI, MISO, CS, CNT1, CNT2, VD, HD, and I/F1 to I/F8) other than the pins V1 to V4 for power supply may be replaced with each other, as required, so as to facilitate wiring.

As described above, in the eighth embodiment, in a case where the connector 103 cannot help being mounted in the pixel projected area 109, the pins of the connector 103, which are connected to the power supply wiring lines large in current variation, are arranged as close as possible to the end of the imaging substrate 102. This makes it possible to reduce the length of the power supply wiring lines large in current variation in the pixel projected area 109, whereby it is possible to reduce the image noise-generating area.

Figure 18:
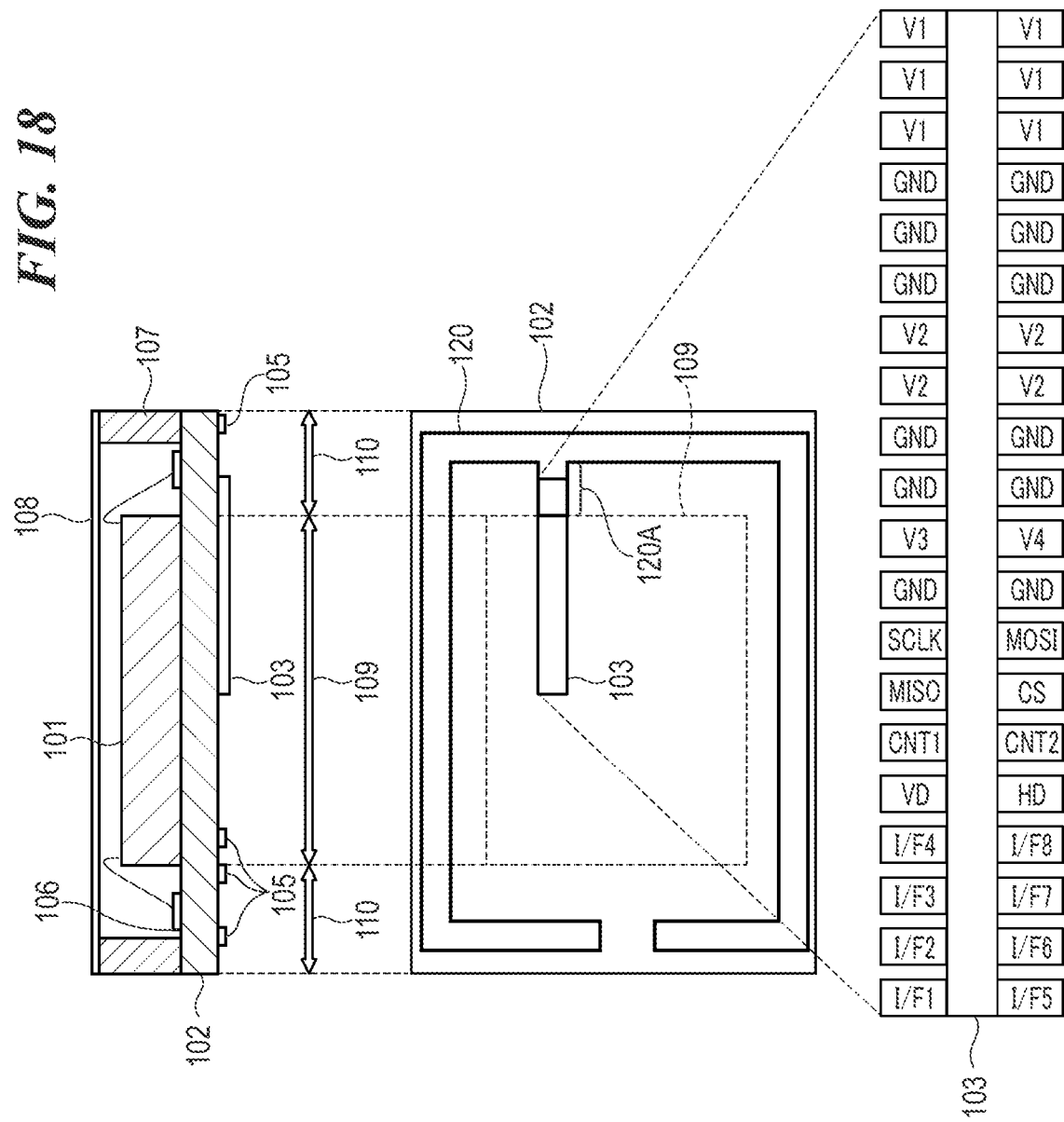
FIG. 18 is a view showing a schematic configuration of an image capturing device unit according to a ninth embodiment.

FIG. 18 is a view showing a schematic configuration of an image capturing device unit according to a ninth embodiment, which is depicted in a form similar to FIG. 21, but illustration corresponding to the right part (the image 901 and the image noise-generating area 909) in FIG. 21 is omitted. Note that the configuration shown in FIG. 16 and the description given with reference to FIG. 16 correspondingly applies to the basic configuration of the image capturing device unit according to the ninth embodiment and hence description thereof is omitted.

In the eighth embodiment, the whole connector 103 is arranged in the pixel projected area 109. In contrast, the ninth embodiment shows an example of the configuration in a case where part of the connector 103 can be arranged in the outside area 110. In other words, the connector 103 is mounted on the imaging substrate 102 such that the connector 103 extends straddling between the pixel projected area 109 and the outside area 110. The connector 103 itself is the same as that described in the eighth embodiment (see FIG. 17), and the pins V1 connected to the power supply wiring lines large in current variation are arranged in the outside area 110. With this, the power supply wiring lines connected to the pins V1 are not required to be arranged in the pixel projected area 109, and hence it is possible to suppress generation of image noise in the pixel projected area 109.

Figure 19:
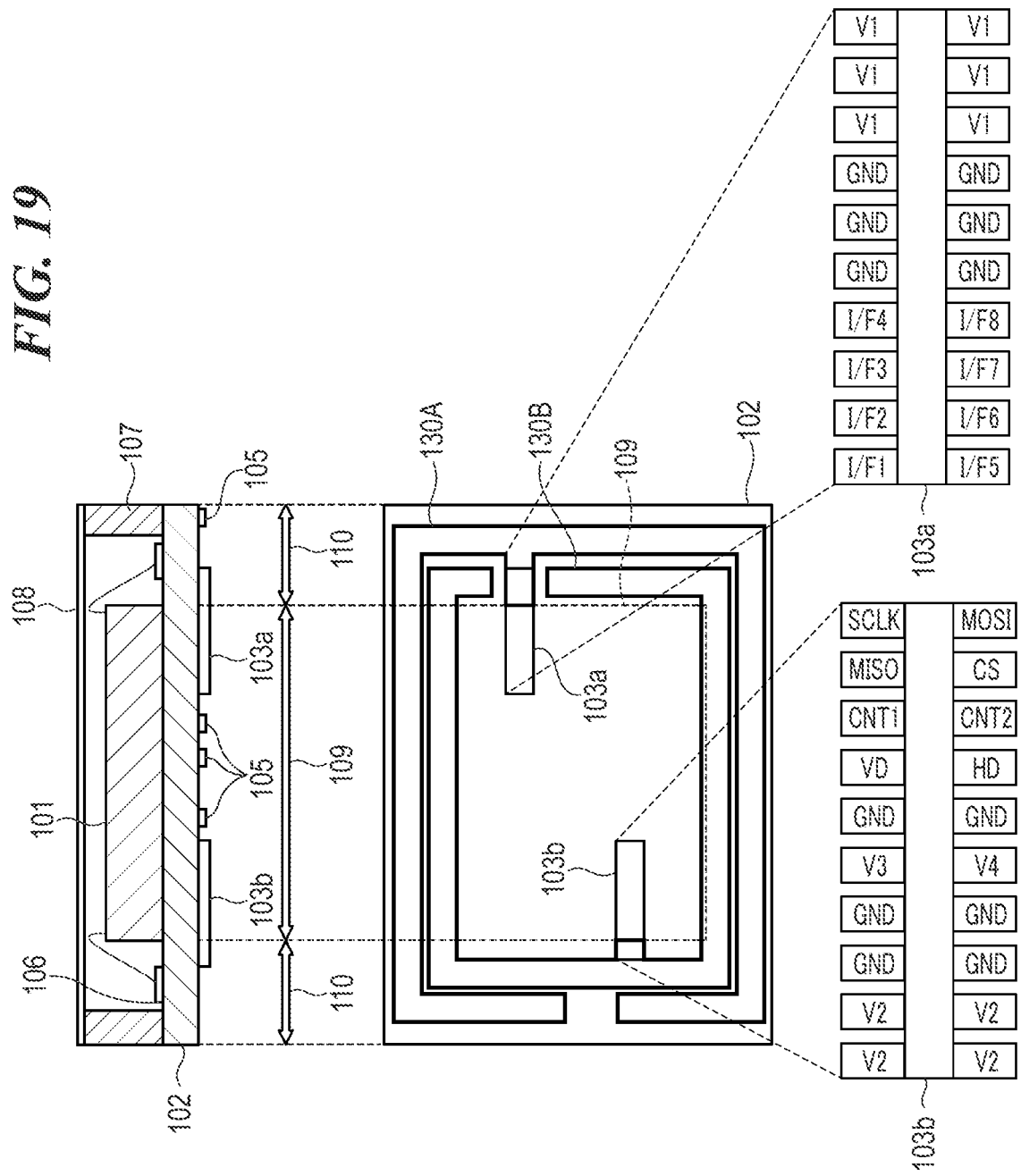
FIG. 19 is a view showing a schematic configuration of an image capturing device unit according to a tenth embodiment.

In a tenth embodiment, the configuration will be described which is effective in a case where there are a plurality of power supply wirings large in current variation. FIG. 19 is a view showing a schematic configuration of an image capturing device unit according to the tenth embodiment, which is depicted in a form similar to FIG. 18. Note that the basic configuration of the image capturing device unit is the same as the configuration shown in FIG. 16 except the connector mounted on the imaging substrate 102 and the power supply wiring arranged on the imaging substrate 102, and the description of the same configuration as that of the eighth embodiment is omitted.

On the imaging substrate 102, there are mounted a first connector 103a and a second connector 103b. The first connector 103a includes the pins V1 for power supply. Further, the second connector 103b includes the pins V2 for power supply. Here, a power supply wiring 130A connected to the pins V1 and formed of metal, such as copper, is arranged on the imaging substrate 102, and is large in current variation. Further, a power supply wiring 130B connected to the pins V2 and formed of metal, such as copper, is arranged on the imaging substrate 102, and is large in current variation.

In the case where there are a plurality of power supply wirings causing current variation responsible for image noise, as described above, the connector is mounted on the imaging substrate 102 in a state divided into a plurality of connectors (two connectors in the present embodiment, i.e. the first connector 103a and the second connector 103b). In this case, the pins V1 and V2 are arranged close to the end of the imaging substrate 102, desirably, in the outside area 110, and the power supply wiring 130A and 130B are arranged such that they are connected to the pins V1 and V2, respectively, as shown in FIG. 19. This makes it possible to reduce generation of image noise generated due to the power supply wirings 130A and 130B large in current variation.

That is, in the tenth embodiment, it is also possible to obtain the same advantageous effects as provided by the eighth embodiment.

Note that the locations of any of the pins for signals (SCLK, MOSI, MISO, CS, CNT1, CNT2, VD, HD, and I/F1 to I/F8) other than the pins V1 to V4 for power supply may be replaced with each other, as required, so as to facilitate wiring.

Figure 20:
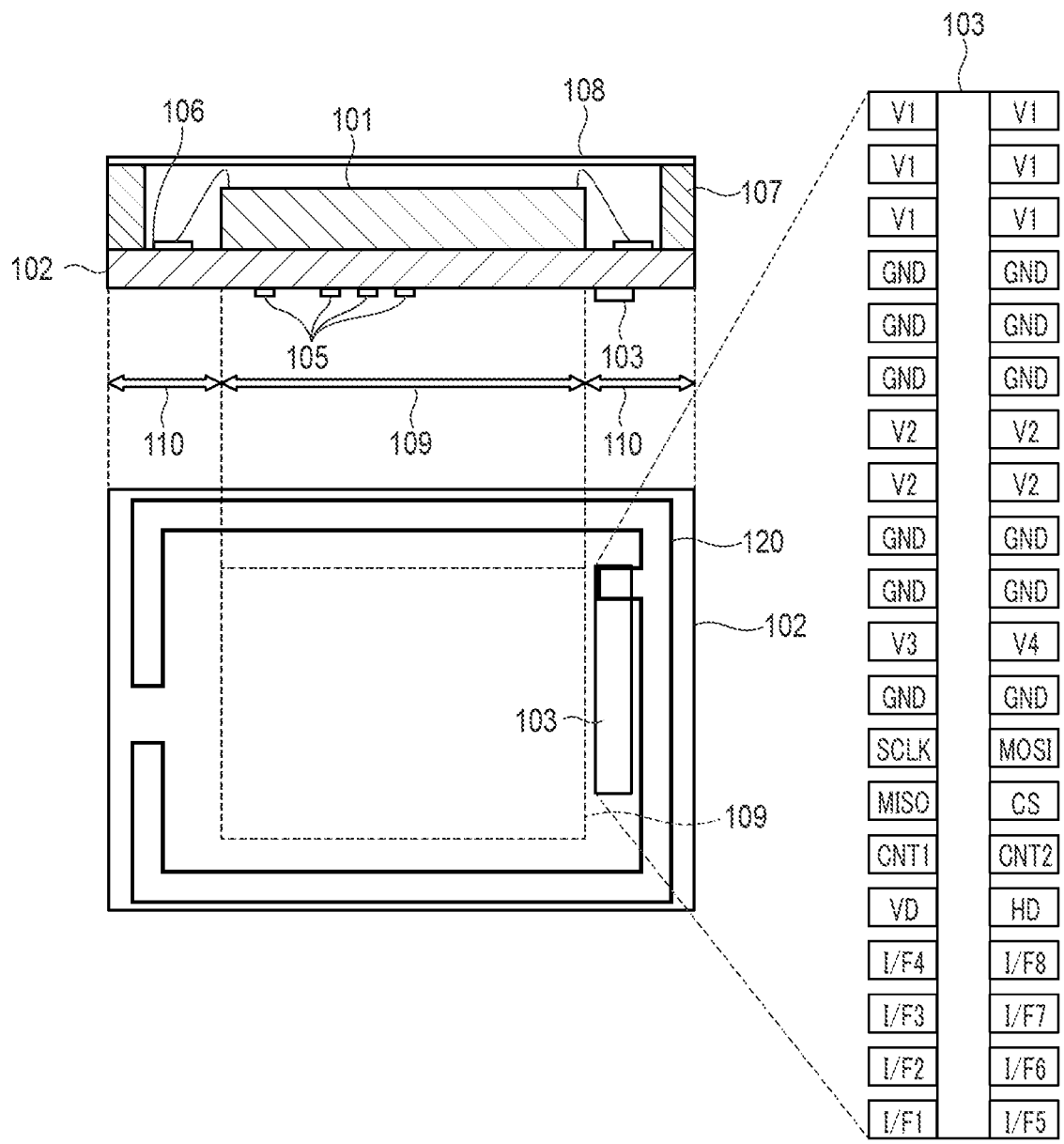
FIG. 20 is a view showing a schematic configuration of an image capturing device unit according to an eleventh embodiment.

Next, an example in which the power supply wiring large in current variation is arranged in the outside area 110 will be described. FIG. 20 is a view showing a schematic configuration of an image capturing device unit according to the eleventh embodiment, which is depicted in a form similar to FIG. 18. Note that the basic configuration of the image capturing device unit is the same as the configuration shown in FIG. 16 except the location of the connector 103 mounted on the imaging substrate 102, and description of the same configuration as that of the eighth embodiment is omitted.

In the eleventh embodiment, there are no restrictions to the location where the connector 103 is mounted, and hence the connector 103 is mounted in the outside area 110 on the imaging substrate 102 and the power supply wiring lines are arranged only in the outside area 110. This makes it possible to more effectively suppress generation of image noise than the above-described configurations in the seventh to tenth embodiments. Note that in a case where the whole connector 103 can be mounted in the outside area 110, the arrangement of pins of the connector 103 is not limited to that shown in FIG. 17 (FIG. 20), and further, there are no particular restrictions. For example, the connector 903 appearing in FIG. 21 can be used.

Although in the above-described eighth to eleventh embodiments, as the connector 103 and the connector 202 connected thereto, board-to-board connectors (B to B connectors) having a plurality of pins (connection pins) is taken up and described by way of example, this is not limitative. For example, the connector 103 may be a flip-type connector having a plurality of pins (connection pins) which are electrically connected to contacts provided on the flexible wiring board 104 itself. Further, as another example, the connector 103 may be a connector of a type having sockets or a type that elastically brings contacts into contact with the imaging substrate 102. Further, a connectorless structure may be employed which joins the flexible wiring board 104 directly to a contact pattern provided on the imaging substrate 102 e.g. with a conductive adhesive. That is, in a case where a plurality of wirings are joined to the imaging substrate 102, by drawing out the power supply wiring lines included in the wirings from a location close to the end of the imaging substrate 102 and connecting the same to the image capturing device, regardless of the joining form, it is possible to obtain the effects of the present invention. Further, the flexible wiring board 104 may be formed with wire wiring using linear members.

The image capturing device units according to the above-described embodiments can be applied not only to image capturing apparatuses, such as digital cameras and digital video cameras, but also to various electronic apparatuses having the image capturing function (such as smartphones, portable game machines, and tablet PCs).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-002890, filed Jan. 10, 2020, No. 2020-002888, filed Jan. 10, 2020, No. 2020-002889, filed Jan. 10, 2020, and No. 2020-211538, filed Dec. 21, 2020, which are hereby incorporated by reference herein in their entirety.

What is claimed is:

1. An image capturing device unit including:
a substrate, and
an image capturing device mounted on the substrate,
wherein the image capturing device comprises:
a first pixel portion that has a plurality of pixels arranged in a matrix in a first direction and a second direction perpendicular to each other; and
output lines that are arranged in parallel to the second direction and which are configured to read out pixel signals in the second direction from every line of pixels arranged in the first direction, and
wherein the substrate comprises:
a power supply wiring that is arranged on a different surface from a surface on which the image capturing device is mounted to supply power to the image capturing device,
wherein a connector that supplies power from an outside is mounted on a surface of the substrate opposite to the surface on which the image capturing device is mounted,
wherein the power supply wiring includes a first power supply wiring portion arranged so as to be substantially parallel to the first direction in a second pixel portion area which overlaps the first pixel portion when the image capturing device is projected onto the substrate in a third direction perpendicular to the first direction and the second direction, such that the first power supply wiring portion is drawn out from an electrical connection portion connected to a power supply terminal of the connector,
wherein the power supply wiring further includes a second power supply wiring portion that is connected to the first power supply wiring portion and the image capturing device,
wherein the second power supply wiring portion is formed along the outer periphery of the substrate in a pixel portion outside area outside the second pixel portion area on the substrate, and
wherein the electrical connection portion is disposed at a position deviated from a central position of the image capturing device and toward an end face of the substrate in the first direction, and the first power supply wiring portion is drawn out from the electrical connection portion toward the end face of the substrate in the first direction.

2. The image capturing device unit according to claim 1, wherein the first power supply wiring portion is formed by a plurality of wiring lines each including a portion extending toward an end face of the substrate.

3. The image capturing device unit according to claim 1, wherein the different surface is a surface opposite to the surface on which the image capturing device is mounted.

4. The image capturing device unit according to claim 1,
wherein the substrate is a multi-layer substrate, and
wherein the first power supply wiring portion is arranged such that the first power supply wiring portion is routed from a surface of the multi-layer substrate opposite to the surface on which the image capturing device is mounted, to an inner layer of the multi-layer substrate, routed in the inner layer to an outer periphery of the second pixel portion area such that the first power supply wiring portion does not extend parallel to the output lines, and then taken out from the inner layer to a surface layer of the multi-layer substrate.

5. The image capturing device unit according to claim 1, wherein the second power supply wiring portion is arranged in the second pixel portion outside area within a predetermined distance from the outer periphery of the second pixel portion area.

6. The image capturing device unit according to claim 1, wherein a capacitor is mounted on the surface of the substrate opposite to the surface on which the image capturing device is mounted, and wherein the capacitor is mounted such that electrodes of the capacitor do not extend parallel to the output lines in the vicinity of the electrical connection portion.

7. The image capturing device unit according to claim 1, wherein the substrate has a plurality of power supply wirings which are drawn out from a power supply connection portion serving as a contact point brought into contact with a connector connected to an external power source, toward ends of the substrate in different directions, and are connected to the image capturing device.

8. The image capturing device unit according to claim 7, wherein the plurality of power supply wirings are arranged such that the plurality of power supply wirings are approximately equal to each other in variation in load current flowing therethrough.

9. The image capturing device unit according to claim 8, wherein the plurality of power supply wirings are arranged such that in a case where any two power supply wirings are selected, an angle formed by directions of drawing out the two power supply wirings from the power supply connection portion is equal to 90 degrees or more.

10. The image capturing device unit according to claim 1, further comprising an electronic component that is mounted on the substrate to supply power to the image capturing device, and wherein the substrate has a plurality of power supply wirings which are drawn out from a power supply connection portion serving as a contact point brought into contact with the electronic component, toward an end of the substrate and are connected to the image capturing device.

11. The image capturing device unit according to claim 10, wherein the plurality of power supply wirings are arranged so as to be approximately equal to each other in variation in load current flowing therethrough.

12. The image capturing device unit according to claim 11, wherein the plurality of power supply wiring lines are arranged such that in a case where any two power supply wiring lines are selected, an angle formed by directions of drawing out the two power supply wiring lines from the power supply connection portion is equal to 90 degrees or more.

13. The image capturing device unit according to claim 1,
wherein the connector comprises a plurality of connectors, and
wherein the power supply wiring is provided for each of the plurality of connectors.

14. The image capturing device unit according to claim 1, wherein the power supply wiring is drawn out from a portion of a connector that is mounted on the substrate and supplies power to the image capturing device, which portion is close to an end of the substrate, to an area which does not overlap the image capturing device, as viewed in a direction perpendicular to the imaging surface of the image capturing device, and is connected from the area to the image capturing device.

15. An image capturing apparatus including the image capturing device unit according to claim 1.

* * * * *